(12) United States Patent
Ding

(10) Patent No.: US 10,944,363 B2
(45) Date of Patent: Mar. 9, 2021

(54) POWER AMPLIFIER

(71) Applicant: Advanced Semiconductor Engineering, Inc., Kaohsiung (TW)

(72) Inventor: Jaw-Ming Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/024,059

(22) Filed: Jun. 29, 2018

(65) Prior Publication Data

US 2020/0007086 A1 Jan. 2, 2020

(51) Int. Cl.
*H03F 1/02* (2006.01)
*H03F 3/24* (2006.01)
*H03F 3/193* (2006.01)

(52) U.S. Cl.
CPC ........... *H03F 1/0211* (2013.01); *H03F 3/193* (2013.01); *H03F 3/245* (2013.01); *H03F 2200/129* (2013.01); *H03F 2200/451* (2013.01)

(58) Field of Classification Search
CPC .... H03F 3/245; H03F 3/193; H03F 2200/129; H03F 2200/451; H03F 1/30; H03F 1/0261; H03F 3/19; H03F 3/21

USPC .......................... 330/288, 285, 296, 289, 277
See application file for complete search history.

(56) References Cited

U.S. PATENT DOCUMENTS

| | | | |
|---|---|---|---|
| 7,274,258 B2 * | 9/2007 | Wang | H03F 1/0261 330/285 |
| 8,879,666 B2 | 11/2014 | Ding et al. | |
| 9,065,389 B2 | 6/2015 | Ding et al. | |
| 9,755,578 B2 | 9/2017 | Shi et al. | |
| 9,800,216 B2 * | 10/2017 | Pukhovski | H03F 3/19 |
| 10,158,327 B2 * | 12/2018 | Kim | H03F 1/0205 |

\* cited by examiner

*Primary Examiner* — Hieu P Nguyen
(74) *Attorney, Agent, or Firm* — Foley & Lardner LLP

(57) ABSTRACT

The present disclosure relates to a power amplifier circuit. The power amplifier circuit includes a voltage-controlled current source and a current mirror. The voltage-controlled current source is configured to receive a first voltage and to generate a first current. The current mirror is connected to the voltage-controlled current source and to generate a second current in response to the first current. The second current continuously changes from 0 mA to about 120 mA as the first voltage continuously changes from 0 V to about 1 V.

24 Claims, 29 Drawing Sheets

US 10,944,363 B2

POWER AMPLIFIER

BACKGROUND

1. Technical Field

The present disclosure relates to a power amplifier, and more particularly, to a bias circuit for a power amplifier.

2. Description of the Related Art

A power amplifier is a circuit in a wireless transceiver for amplifying a signal to be transmitted. The power amplifier can be powered by a power source circuit, such as a current source (or a current sink) connected with a current mirror. As the transmission distance changes, the power applied to the power amplifier should also change. Therefore, it is desirable to provide a power amplifier that can operate in a low-power mode for short-distance transmission and in a high-power mode for long-distance transmission.

SUMMARY

In accordance with an aspect of the present disclosure, a power amplifier circuit includes a voltage-controlled current source and a current mirror. The voltage-controlled current source is configured to receive a first voltage and to generate a first current. The current mirror is connected to the voltage-controlled current source and to generate a second current in response to the first current. The second current continuously changes from 0 mA to about 120 mA as the first voltage continuously changes from 0 V to about 1 V.

In accordance another aspect of the present disclosure, a power amplifier circuit includes a voltage-controlled current source and a current mirror. The voltage-controlled current source is configured to receive a first voltage and to generate a first current. The voltage-controlled current source includes a current generation device configured to generate a second current directly proportional to the square of the first voltage. The first current is directly proportional to the square of the first voltage. The current mirror is connected to the voltage-controlled current source and configured to generate a third current in response to the first current.

In accordance another aspect of the present disclosure, a power amplifier circuit includes a voltage-controlled current source and a current mirror. The voltage-controlled current source is configured to receive a first voltage and to generate a first current in response to the first voltage. The current mirror is connected to the voltage-controlled current source and to generate a second current. The second current exponentially increases as the first voltage increases.

Figure 1A:
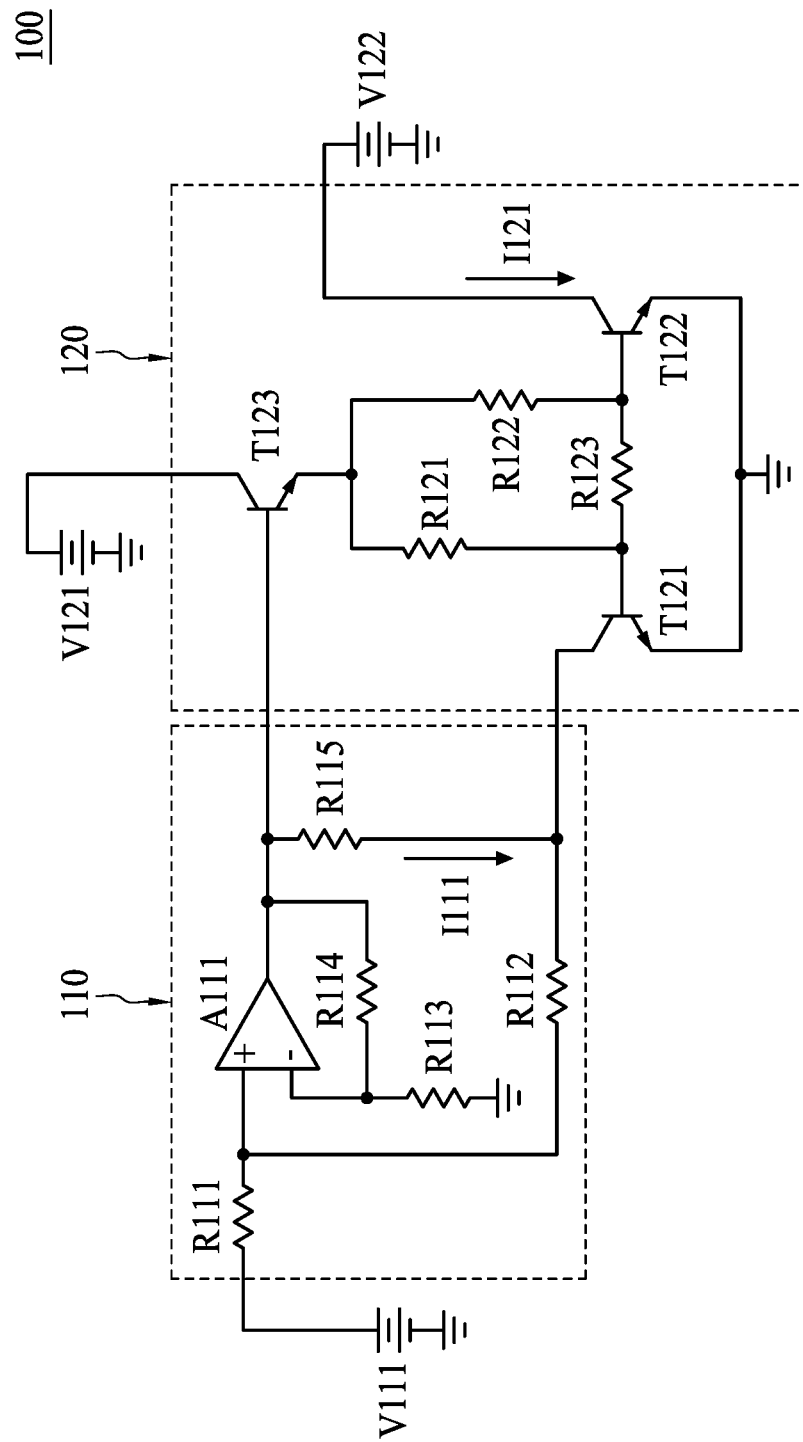
FIG. 1A is a schematic diagram illustrating a power amplifier in accordance with some embodiments of the present disclosure.

Common reference numerals are used throughout the drawings and the detailed description to indicate the same or similar components. The present disclosure can be readily understood from the following detailed description taken in conjunction with the accompanying drawings.

DETAILED DESCRIPTION

Although described with particular reference to a portable transceiver, the circuit and method for biasing a gallium arsenide (GaAs) power amplifier (also referred to as the GaAs bias circuit) can be implemented in any GaAs device in which it is desirable to provide a bias current and voltage. Furthermore, the circuitry described below can be fabricated using an integrated bipolar-field effect transistor (BIFET) process utilizing a lower turn-on voltage of field effect transistors. Furthermore, in particular embodiments, the transistors described below include bipolar junction transistors (referred to as a BJT), which includes heterojunction bipolar junction transistors (referred to as an HBT) and field effect transistors (referred to as a FET) or pseudomorphic high-electron mobility transistors (referred to as a pHEMT) that are fabricated using what is referred to as the BIFET or BiHEMT process.

As used herein, reference to a gate, source, drain, or other component of a transistor or other circuit component being connected to a gate, source, drain, or other component of another transistor or other circuit component can refer to a direct connection, or to a connection with another circuit component (e.g. a transistor) disposed therebetween.

FIG. 1A is a schematic diagram illustrating a power amplifier 100 in accordance with some embodiments of the present disclosure. The power amplifier 100 includes a voltage-controlled current source 110 and a current mirror circuit 120.

The voltage-controlled current source 110 includes an amplifier A111 and resistors R111, R112, R113, R114 and R115. The amplifier A111 includes a first input (e.g., the positive terminal "+"), a second input (e.g., the negative terminal "−") and an output. The first input of the amplifier A111 is connected to one terminal of the resistor R111, and the other terminal of the resistor R111 is connected to a voltage source to receive a voltage V111. The resistor R112 is connected between the first input of the amplifier A111 and the current mirror circuit 120. The resistor R113 is connected between the second input of the amplifier A111 and ground. The resistor R114 is connected between the second input of the amplifier A111 and the output of the amplifier A111. The resistor R115 is connected between the output of the amplifier A111 and the current mirror circuit 120.

The current mirror circuit 120 includes transistors T121, T122 and T123 and resistors R121, R122 and R123. In some embodiments, the transistors T121, T122 and T123 are bipolar junction transistors (BJT) or any other suitable transistors. The transistor T121 has a collector connected to the resistors R112 and R115, a base connected to the resistors R121 and R123 and an emitter connected to ground. The transistor T122 has a collector connected to a voltage source to receive a voltage V122, a base connected to the resistors R122 and R123 and an emitter connected to ground. The transistor T123 having a collector connected to a voltage source to receive a voltage V121, a base connected to the output of the amplifier A111 and the resistors R114 and R115 and an emitter connected to the resistors R121 and R122.

Figure 1B:
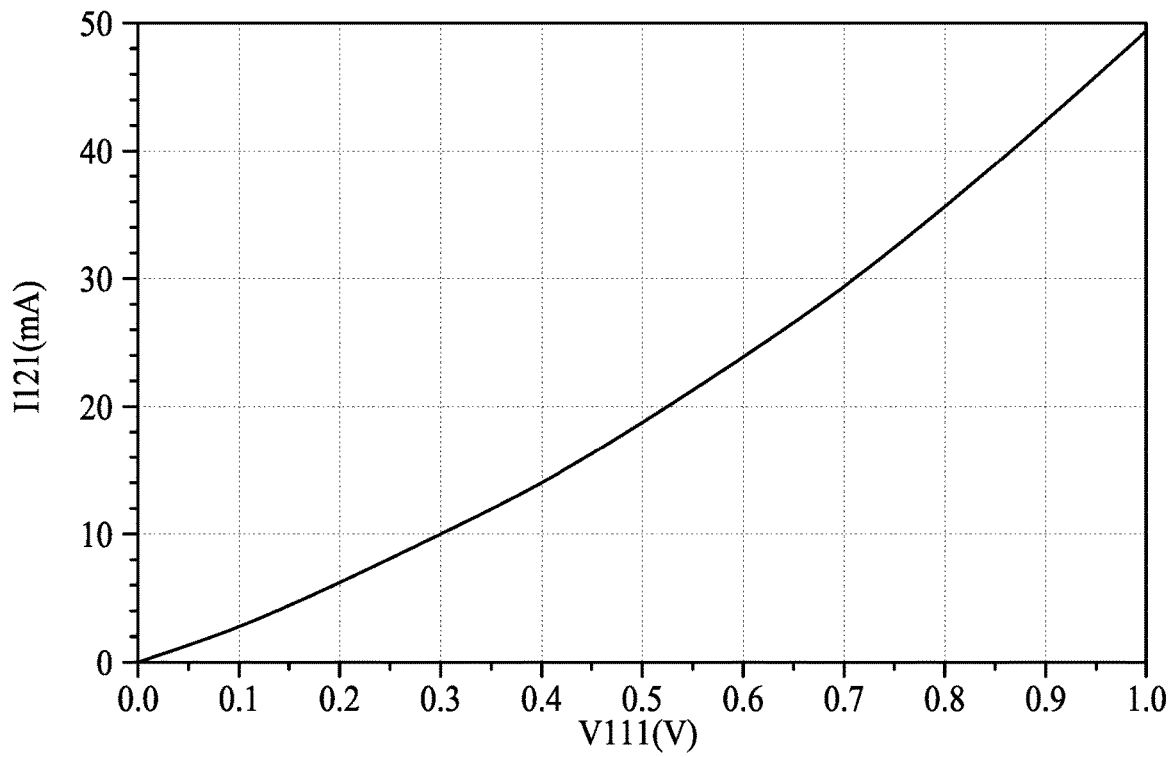
FIG. 1B, FIG. 1C, FIG. 1D and FIG. 1E illustrate simulation results of the power amplifier shown in FIG. 1A in accordance with some embodiments of the present disclosure.

In some embodiments, the voltage-controlled current source 110 is configured to receive the voltage V111 and to generate a current I111 in response to the voltage V111. The current mirror circuit 120 is connected to the voltage-controlled current source 110 and configured to generate a current I121 in response to the current I111. The current I121 is proportional to the voltage V111. In some embodiments, as shown in FIG. 1B, which illustrates a simulation result of the power amplifier 100 in FIG. 1A, the current I121 continuously changes from 0 mA to about 50 mA as the voltage V111 continuously changes from 0 V to about 1 V. Therefore, the voltage V111 also can be referred to as an input control voltage. Compared with other power amplifiers, the power amplifier 100 provide a relatively wide range (or resolution) of the current I121, which improves the performance of the power amplifier 100 operating for both short-distance transmission and long-distance transmission. In addition, the other power amplifiers specify a reference voltage to generate the bias current. However, the reference voltage specifies an additional bias circuit, which would increase the area and the design complexity of the power amplifiers. In accordance with the embodiments shown in FIG. 1A, no reference voltage bias circuit is required, which can reduce the area and the design complexity of the power amplifier 100.

Figure 1C:
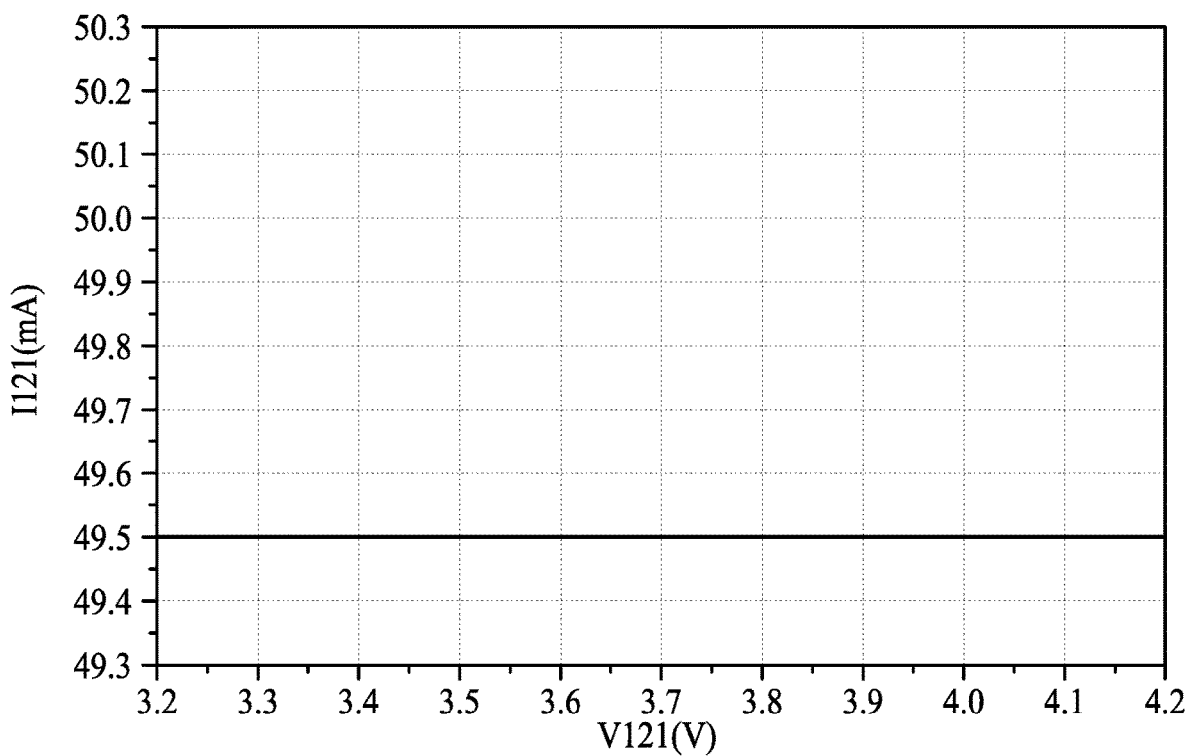
Figure 1D:
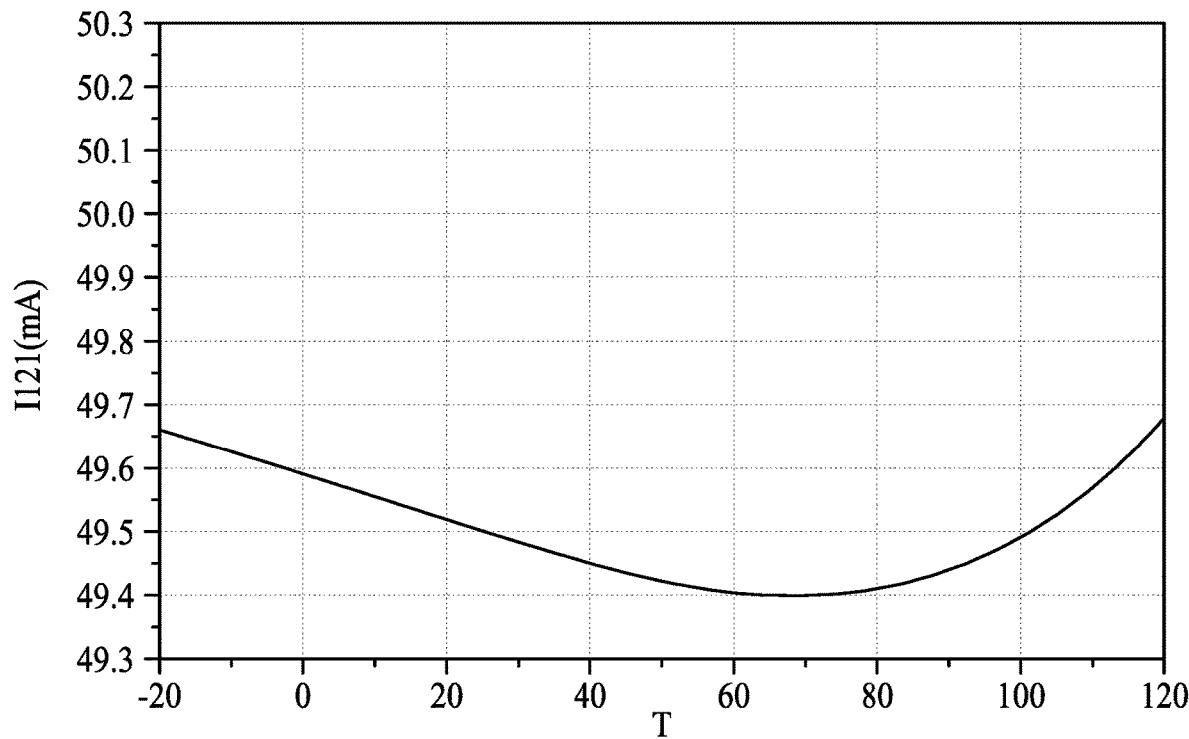
Figure 1E:
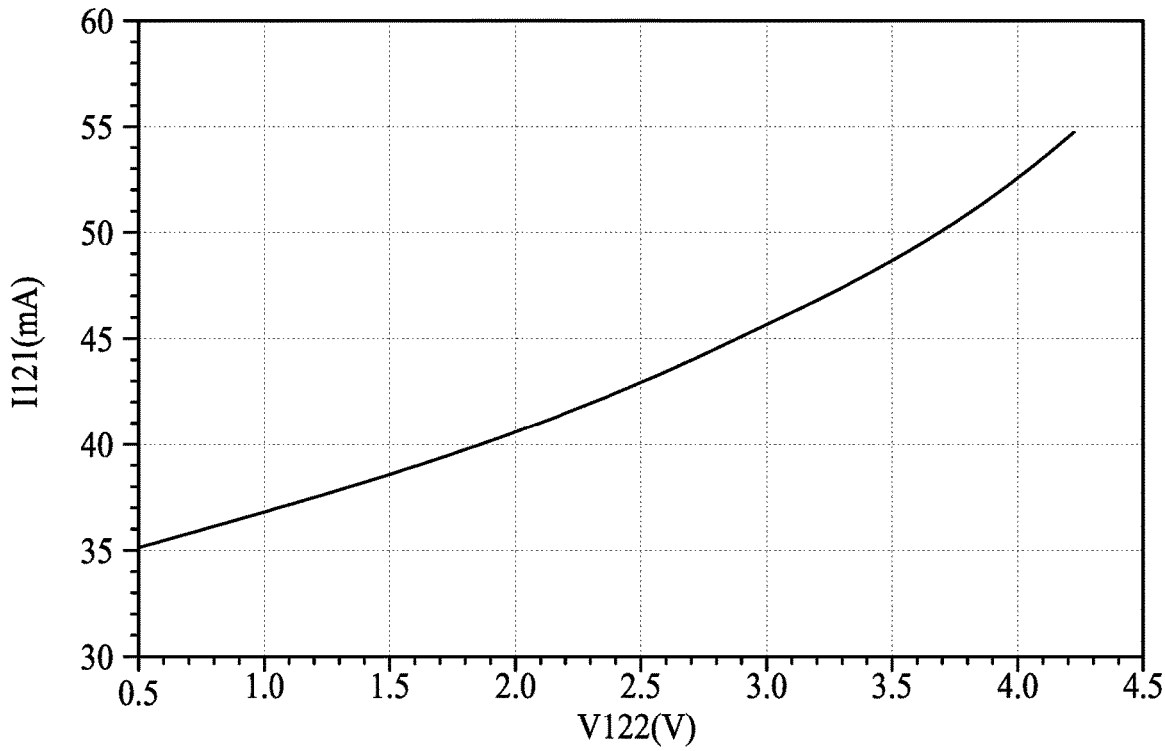

FIGS. 1C, 1D and 1E illustrate simulation results of the power amplifier 100 in FIG. 1A in accordance with some embodiments of the present disclosure. As shown in FIG. 1C, the current I121 substantially remains at a fixed value even as the voltage V121 (e.g., which can be provided by a battery of an electronic device including the power amplifier 100) continuously changes from about 3.2V to about 4.2V, which shows that the current I121 would not be influenced by the variation of the voltage V121. As shown in FIG. 1D, the current I121 changes between about 49.4 mA and about 49.7 mA as the temperature of the power amplifier 100 changes from about −20° C. to about 120° C. This means that the power amplifier 100 in FIG. 1A has a function of temperature compensation. In other words, the temperature has little influence on the current I121. In some embodiments, temperature compensation can be achieved by the resistors R121 and R122. As shown in FIG. 1E, the current I121 continuously changes from 35 mA to about 55 mA as the voltage V122 continuously changes from 0.5 V to about 4.2 V. In some embodiments, the voltage V122 can be provided by an envelope tracking power (ETP) or an average power tracking (APT).

Figure 2A:
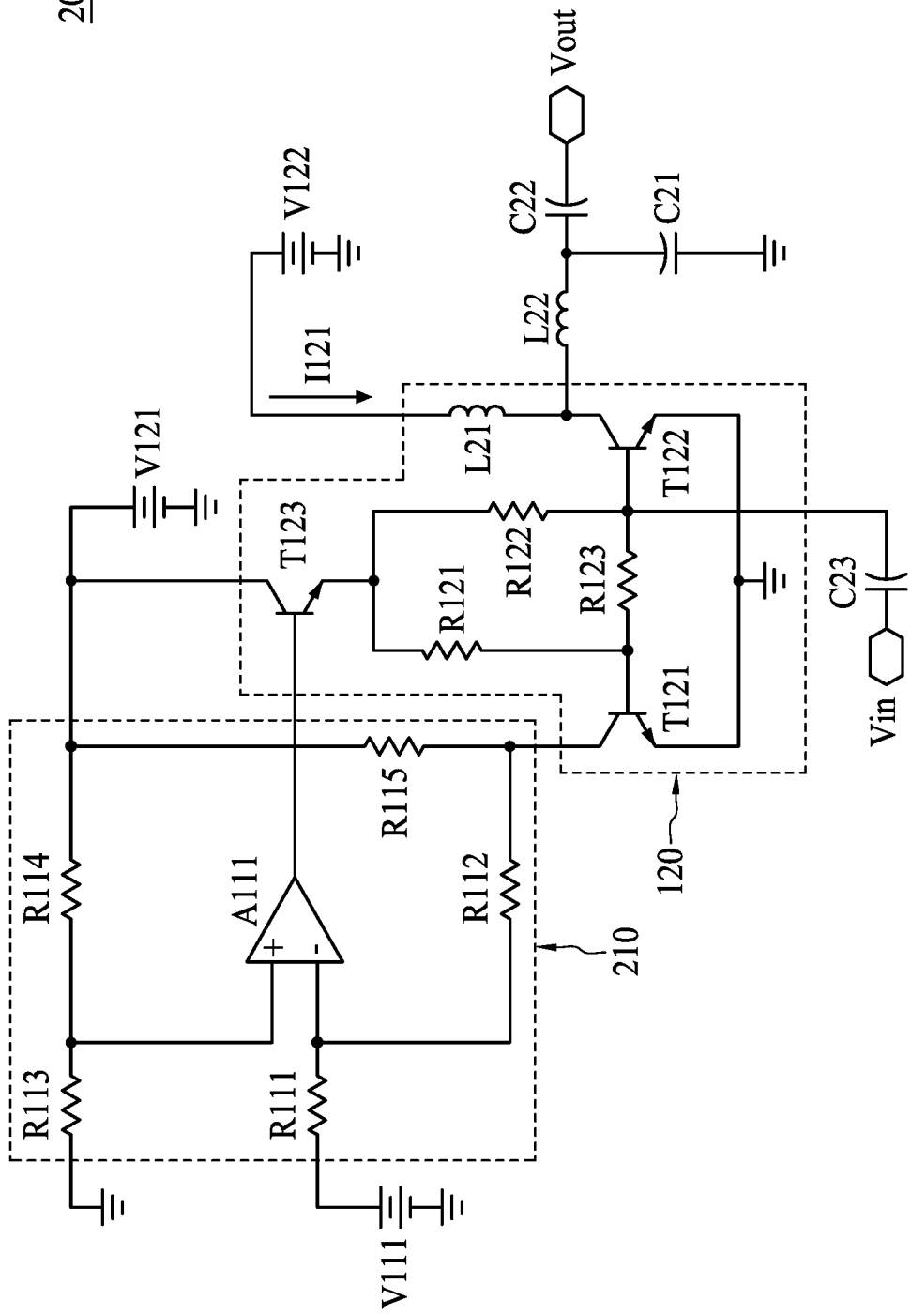
FIG. 2A is a schematic diagram illustrating a power amplifier in accordance with some embodiments of the present disclosure.

FIG. 2A is a schematic diagram illustrating a power amplifier 200 in accordance with some embodiments of the present disclosure. The power amplifier 200 is similar to the power amplifier 100 in FIG. 1A except that in the current-controlled voltage source 210 of the power amplifier 200, the resistors R114 and R115 are connected to the voltage source to receive the voltage V121. In addition, FIG. 1A merely illustrates direct current (DC) bias circuits, while in FIG. 2A, both DC bias circuits and high frequency elements (e.g., inductors L21 and L22 and capacitors C21, C22 and C23) are illustrated. These high frequency elements can be applicable to the power amplifier 100 in FIG. 1A.

The base of the transistor T122 is connected to a radio frequency (RF) input Vin of the power amplifier 200 through the capacitor C23 to receive a RF signal. The collector of the transistor T122 is connected to the inductor L21 and the inductor L22. The capacitor C21 is connected between the inductor L22 and ground. The capacitor C22 is connected between the inductor L22 and an RF output Vout to output an amplified signal corresponding to the RF signal. In some embodiments, the inductors L21 and L22 can be deemed as short circuits and the capacitors C21, C22 and C23 can be deemed as open circuits at a low frequency (e.g., DC).

Figure 2B:
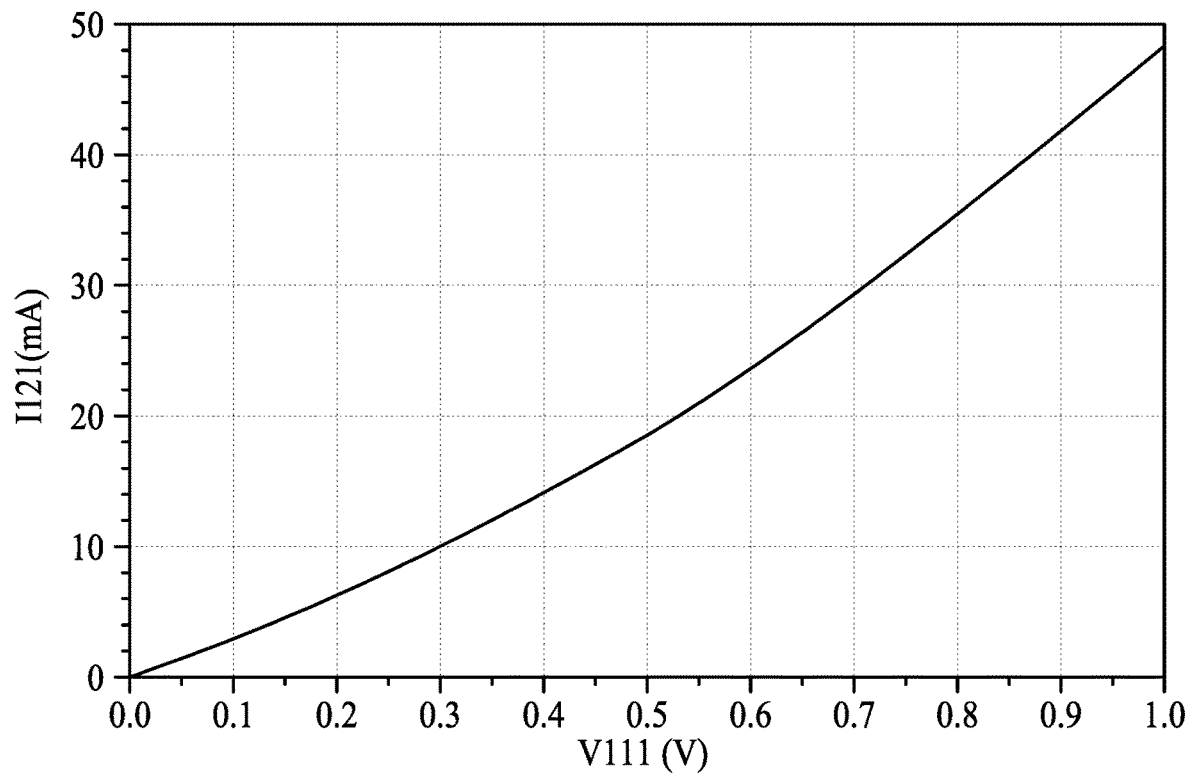
FIG. 2B, FIG. 2C, FIG. 2D and FIG. 2E illustrate simulation results of the power amplifier shown in FIG. 2A in accordance with some embodiments of the present disclosure.
Figure 2C:
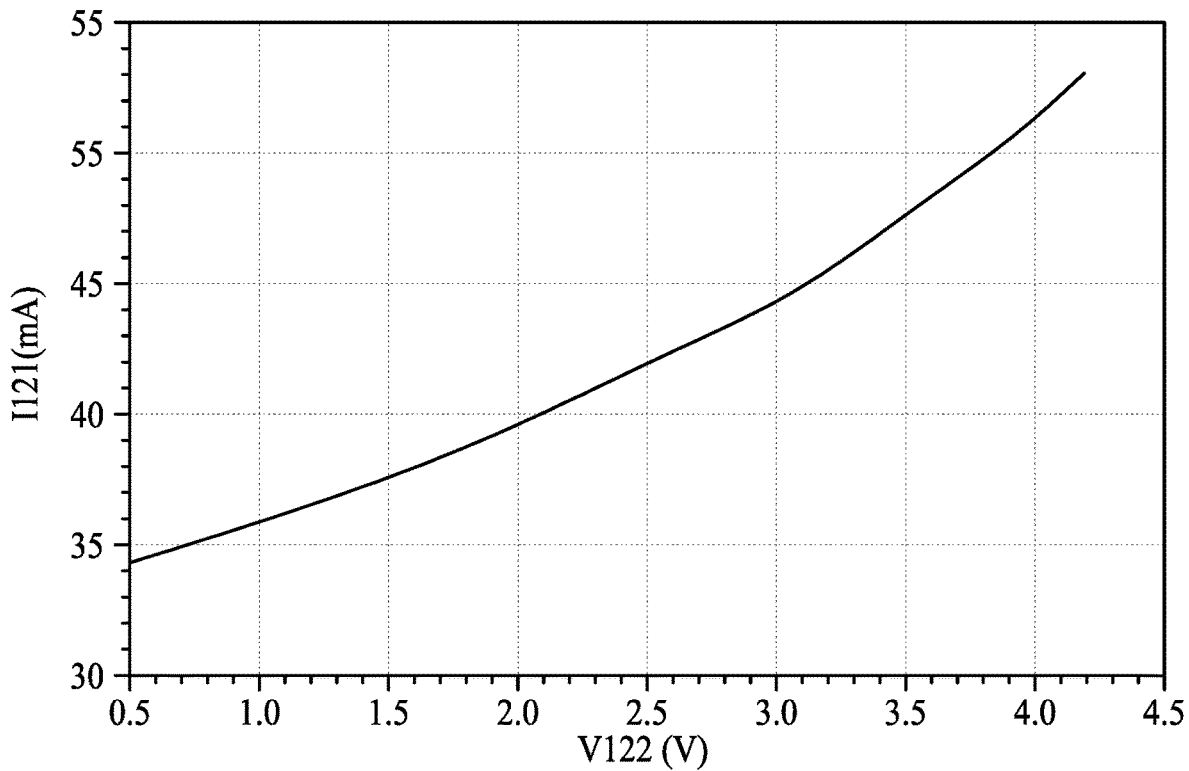
Figure 2D:
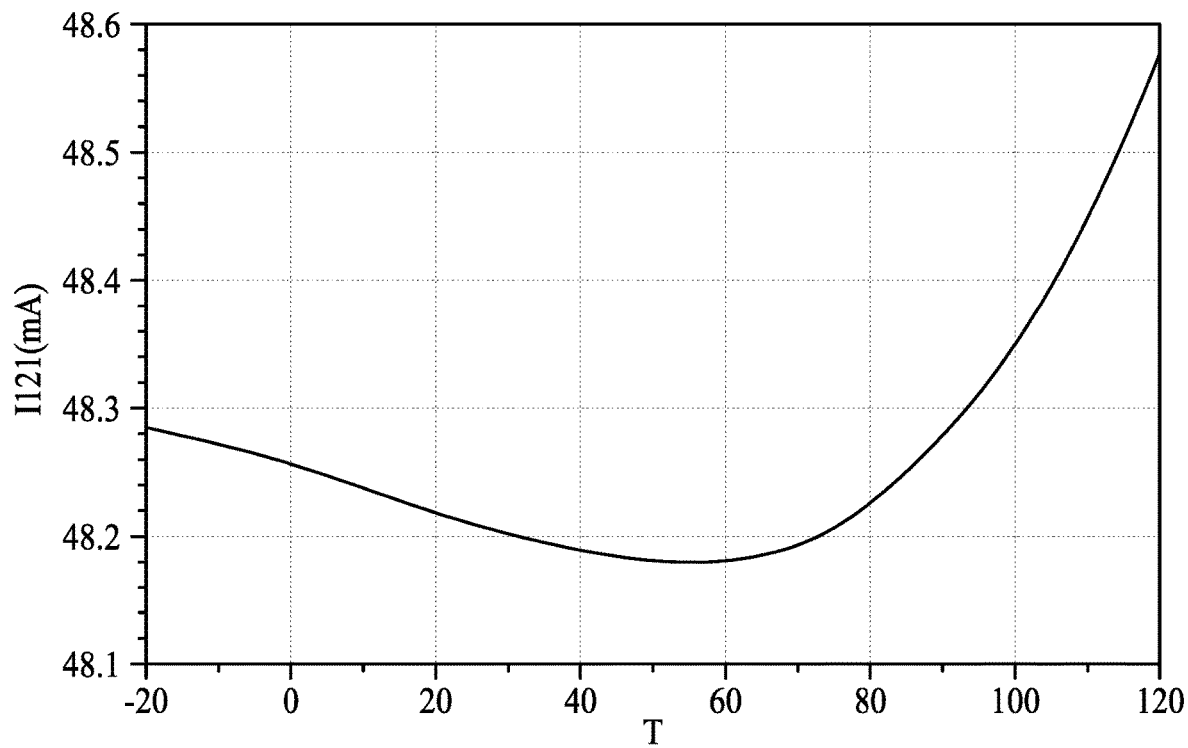
Figure 2E:
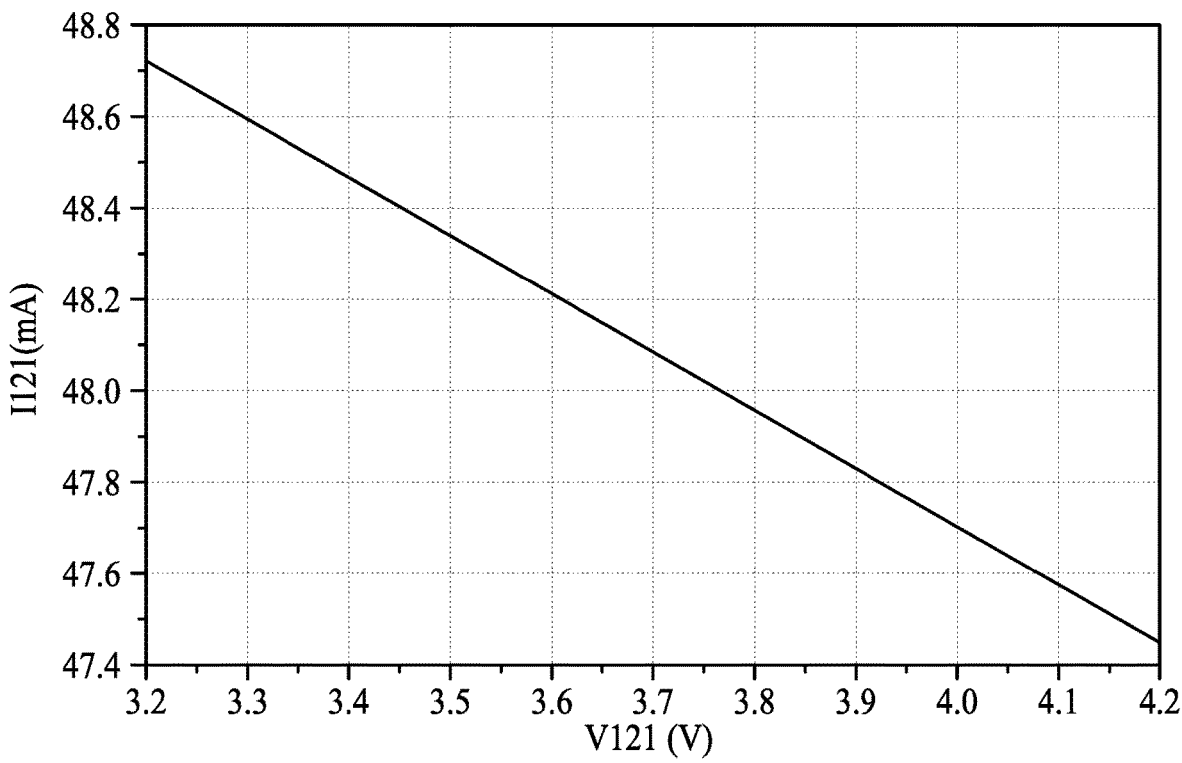

FIGS. 2B, 2C, 2D and 2E illustrate simulation results of the power amplifier 200 in FIG. 2A in accordance with some embodiments of the present disclosure. The electrical characteristics and the advantages of the power amplifier 200 are similar to those of the power amplifier 100 in FIG. 1A. For example, as shown in FIG. 2B, the current I121 continuously changes from 0 mA to about 48 mA as the voltage V111 continuously changes from 0 V to about 1 V. As shown in FIG. 2C, the current I121 continuously changes from 34 mA to about 53 mA as the voltage V122 continuously changes from 0.5 V to about 4.2 V. As shown in FIG. 2D, the current I121 changes between about 48.2 mA and about 48.6 mA as the temperature of the power amplifier 200 changes from about −20° C. to about 120° C. As shown in FIG. 2E, the current I121 continuously changes from 47.4 mA to about 48.7 mA as the voltage V121 continuously changes from 3.2 V to about 4.2 V.

Figure 3A:
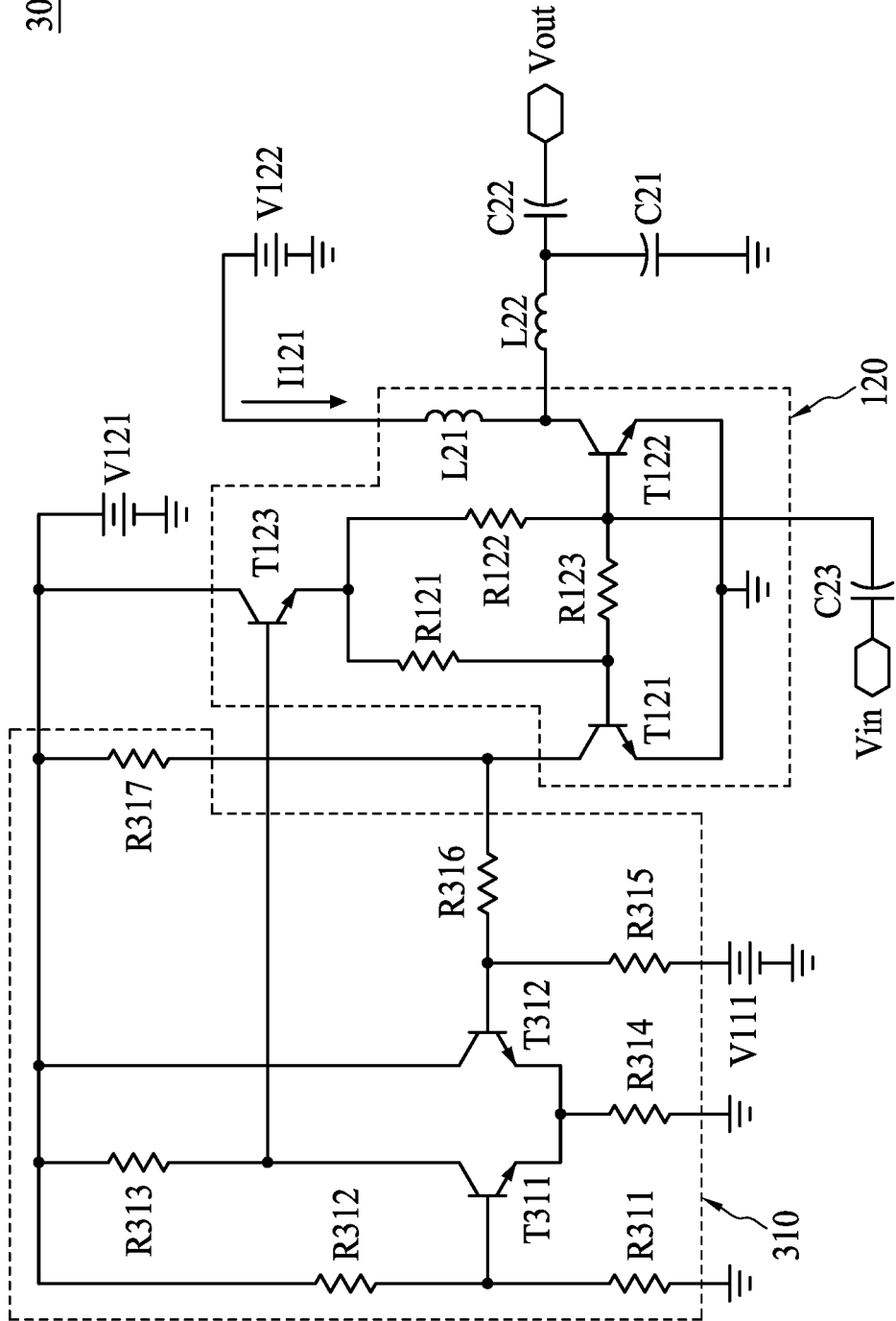
FIG. 3A is a schematic diagram illustrating a power amplifier in accordance with some embodiments of the present disclosure.

FIG. 3A is a schematic diagram illustrating a power amplifier 300 in accordance with some embodiments of the present disclosure. The power amplifier 300 is similar to the power amplifier 200 in FIG. 2A except that a voltage-controlled current source 310 of the power amplifier 300 is different from the voltage-controlled current source 210 of the power amplifier 200.

The voltage-controlled current source 310 includes transistors T311 and T312 and resistors R311, R312, R313, R314, R315, R316 and R317. A base of the transistor T311 is connected to ground through the resistor R311 and to the voltage source to receive the voltage V121 through the resistor R312, an emitter of the transistor T311 is connected to ground through the transistor R314, and a collector of the transistor T311 is connected to the base of the transistor T123 and the voltage source to receive the voltage V121 through the resistor R313. A base of the transistor T312 is connected to the collector of the transistor T121 through the resistor R316 and to the voltage source to receive the voltage V111 through the resistor R315, an emitter of the transistor T312 is connected to ground through the transistor R314, and a collector of the transistor T312 is connected to the voltage source to receive the voltage V121. The resistor R317 is connected between the collector of the transistor T121 and the voltage source to receive the voltage V121.

Figure 3B:
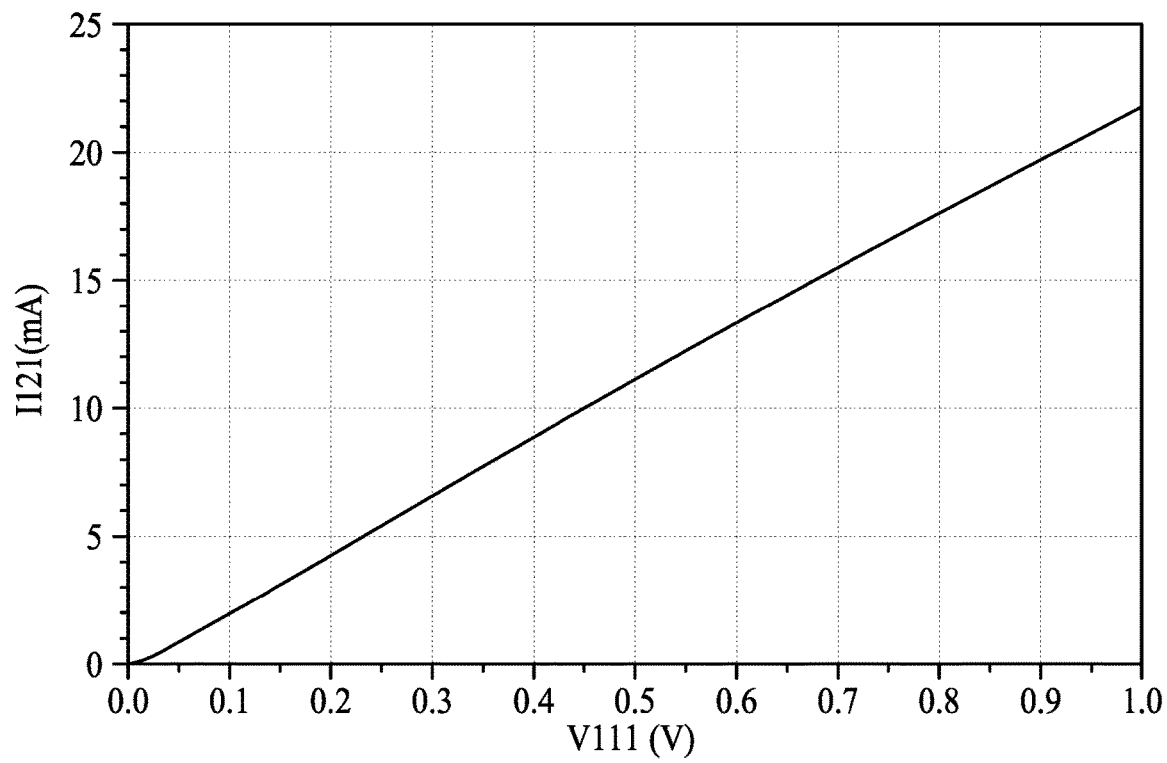
FIG. 3B and FIG. 3C illustrate simulation results of the power amplifier shown in FIG. 3A in accordance with some embodiments of the present disclosure.
Figure 3C:
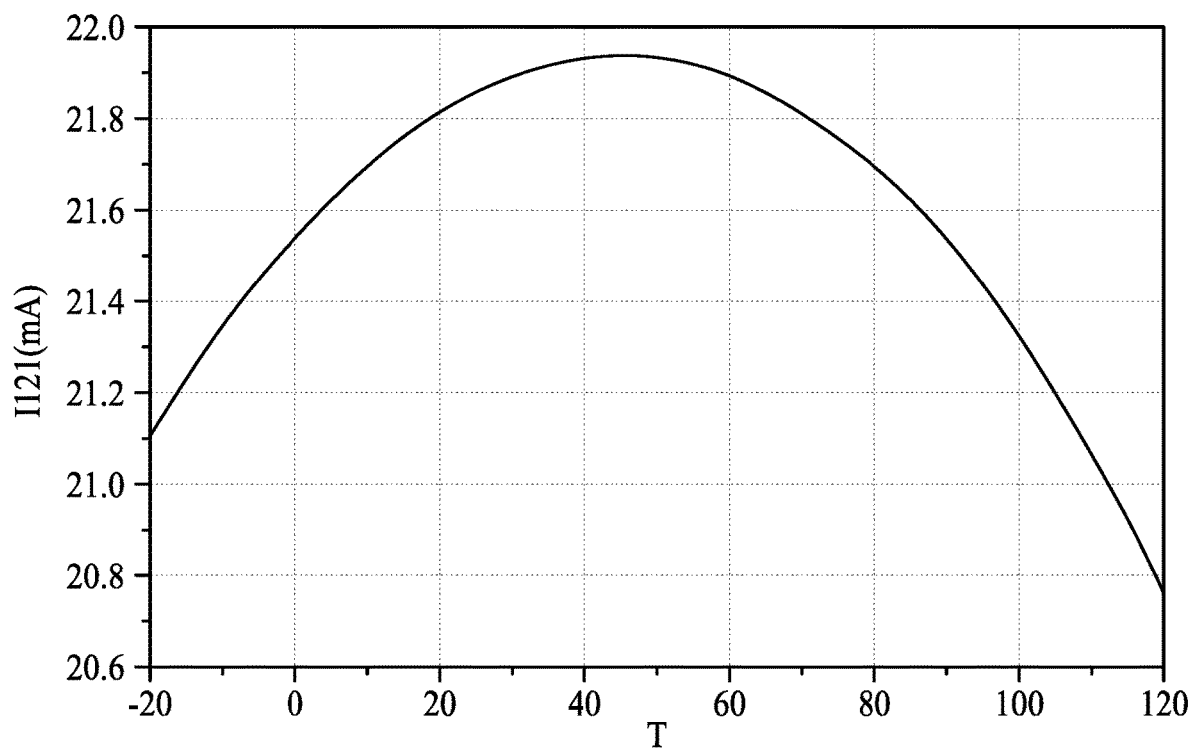

FIGS. 3B and 3C illustrate simulation results of the power amplifier 300 in FIG. 3A in accordance with some embodiments of the present disclosure. The electrical characteristics and the advantages of the power amplifier 300 are similar to those of the power amplifier 200 in FIG. 2A. For example, as shown in FIG. 3B, the current I121 continuously changes from 0 mA to about 22 mA as the voltage V111 continuously changes from 0 V to about 1 V. As shown in FIG. 3C, the current I121 changes between about 20.8 mA and about 21.9 mA as the temperature of the power amplifier 300 changes from about −20° C. to about 120° C.

Figure 4A:
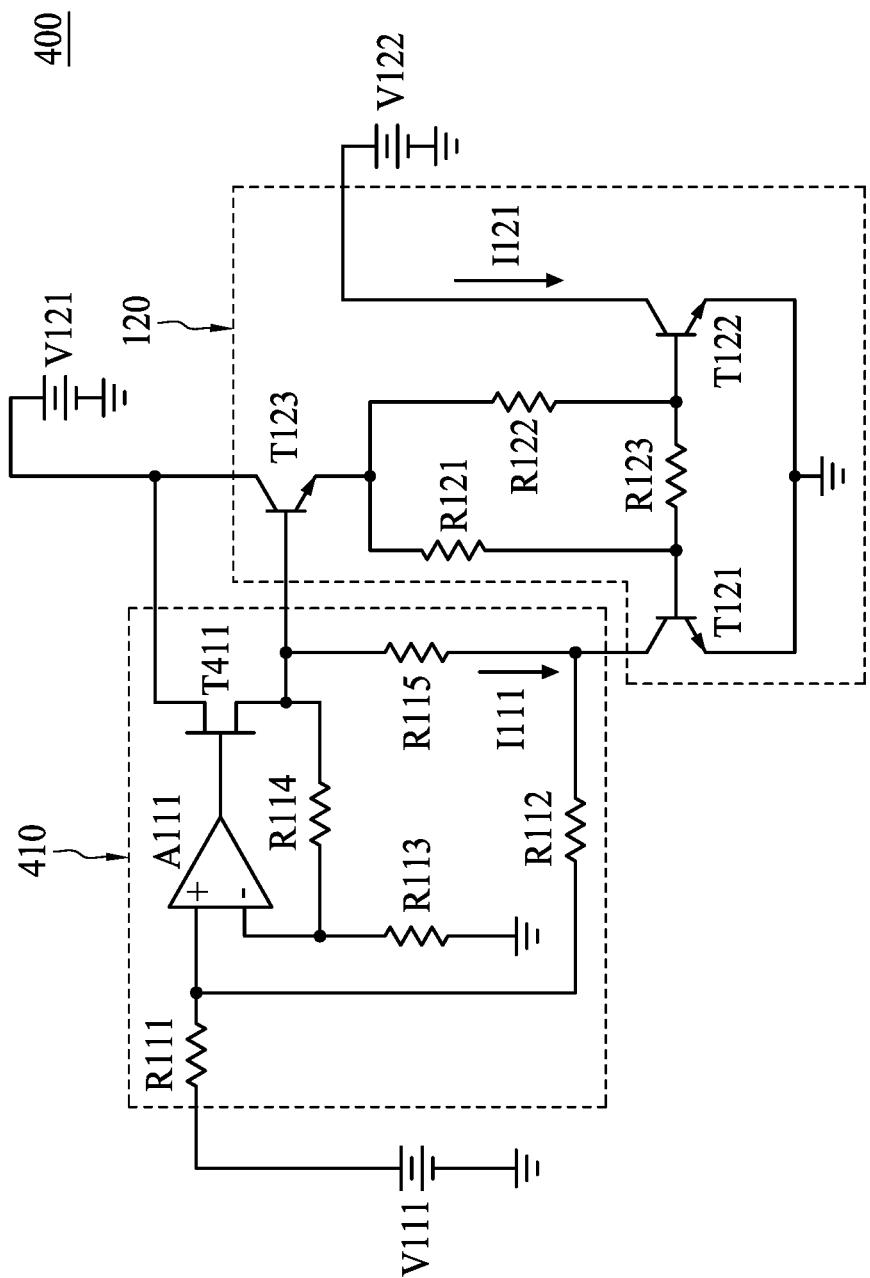
FIG. 4A is a schematic diagram illustrating a power amplifier in accordance with some embodiments of the present disclosure.

FIG. 4A is a schematic diagram illustrating a power amplifier 400 in accordance with some embodiments of the present disclosure. The power amplifier 400 is similar to the power amplifier 100 in FIG. 1A except that a voltage-controlled current source 410 of the power amplifier 400 further includes a transistor T411. In some embodiments, the transistor T411 is a pseudomorphic high electron mobility transistors (pHEMT). A gate of the transistor T411 is connected to the output of the amplifier A111, a source of the transistor T411 is connected to the resistors R114 and R115 and the base of the transistor T123, and a drain of the transistor T411 is connected to the voltage source to receive the voltage V121. In some embodiments, the transistor T411 can be used to reduce the voltage of the output of the amplifier A111 and the current I121, which would reduce the power consumption of the power amplifier 400.

Figure 4B:
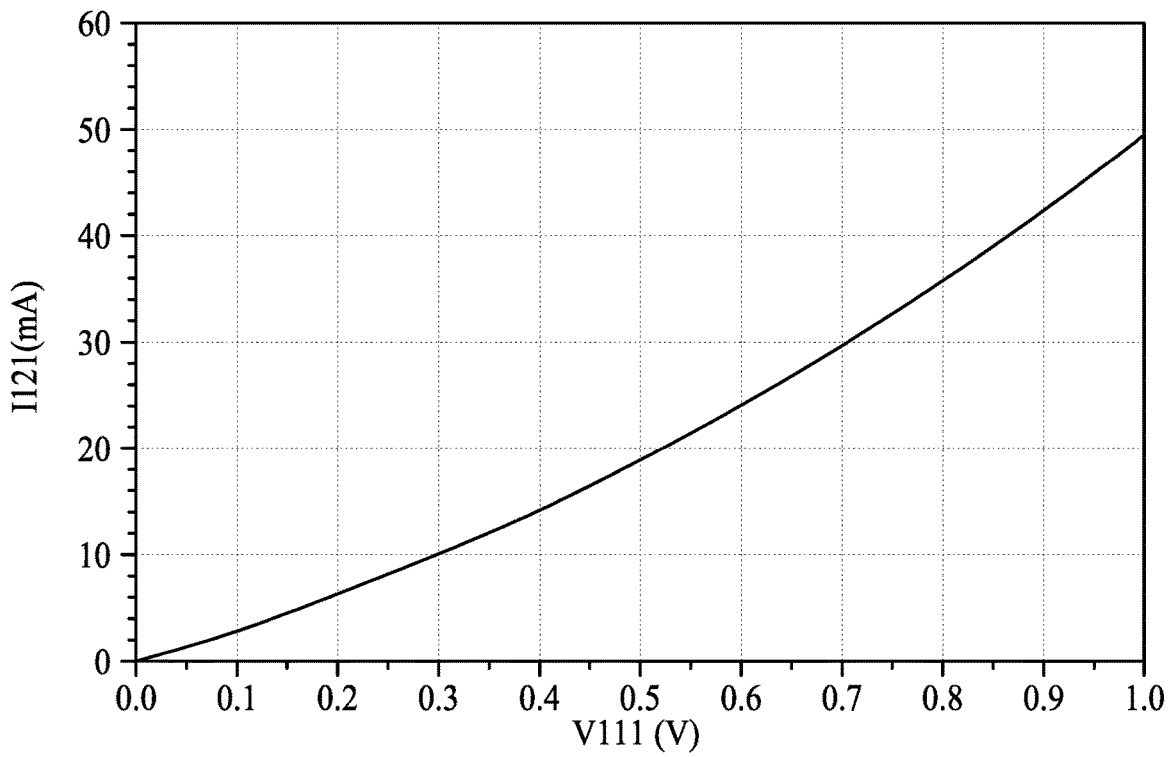
FIG. 4B, FIG. 4C, FIG. 4D and FIG. 4E illustrate simulation results of the power amplifier shown in FIG. 4A in accordance with some embodiments of the present disclosure.
Figure 4C:
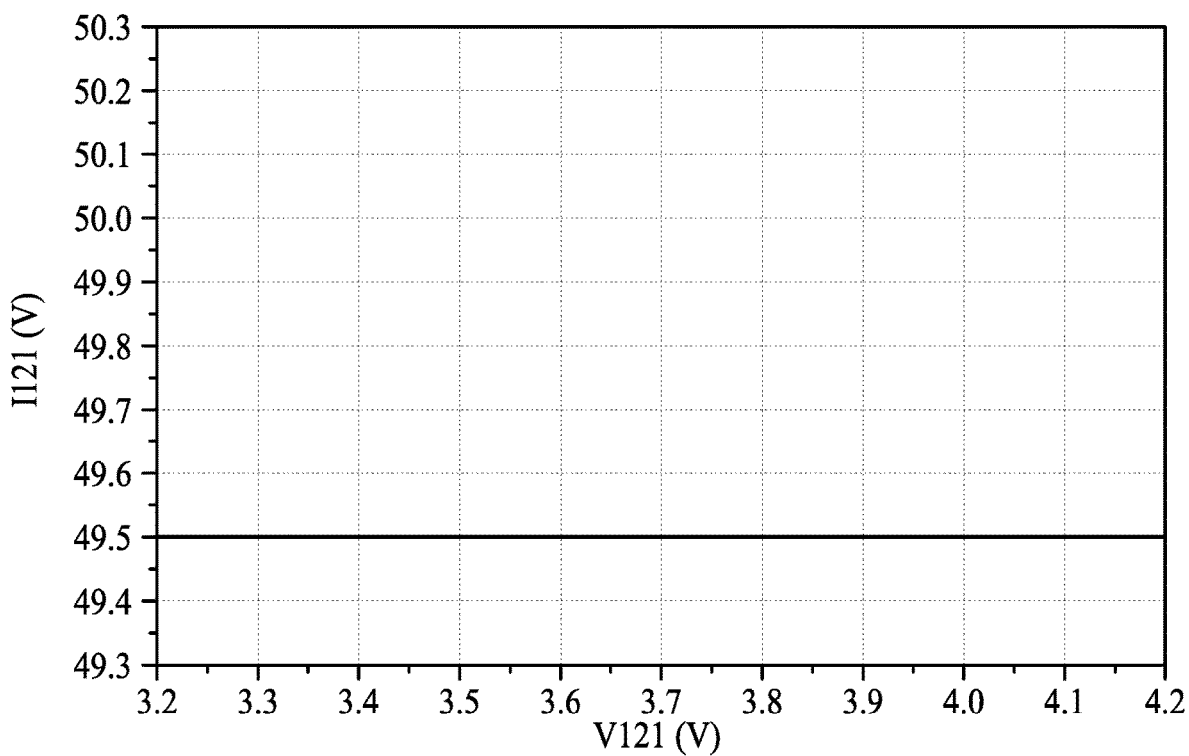
Figure 4D:
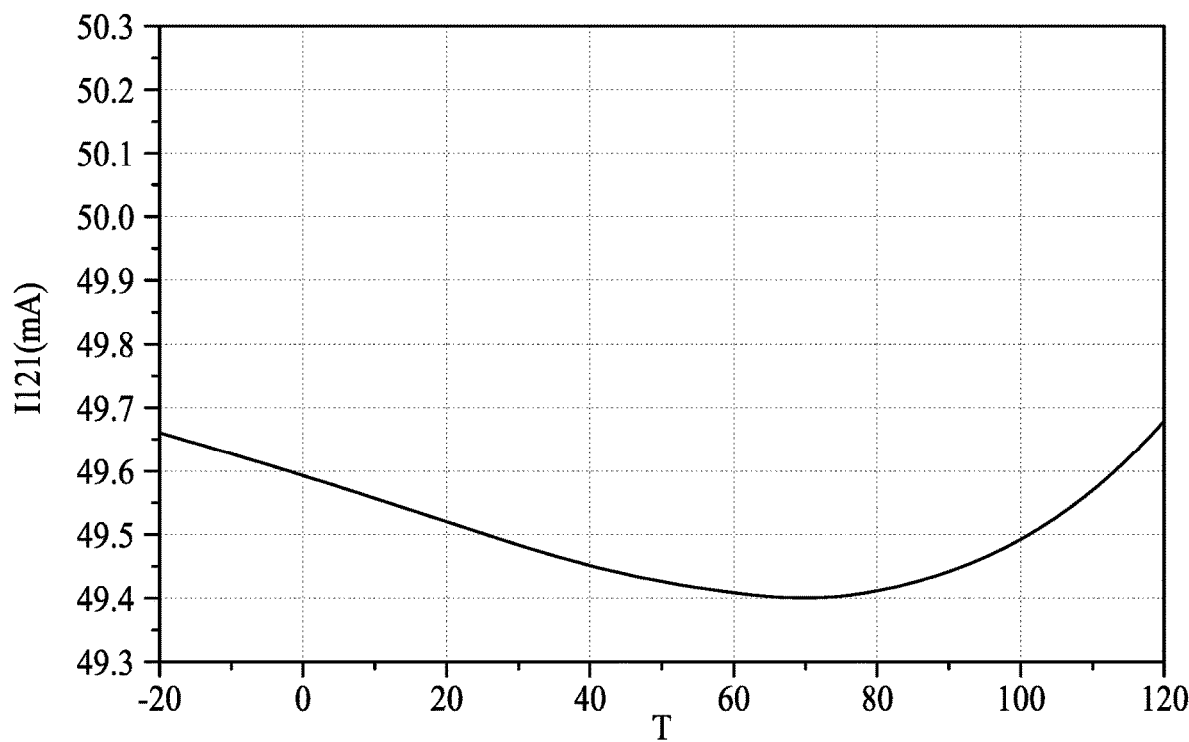
Figure 4E:
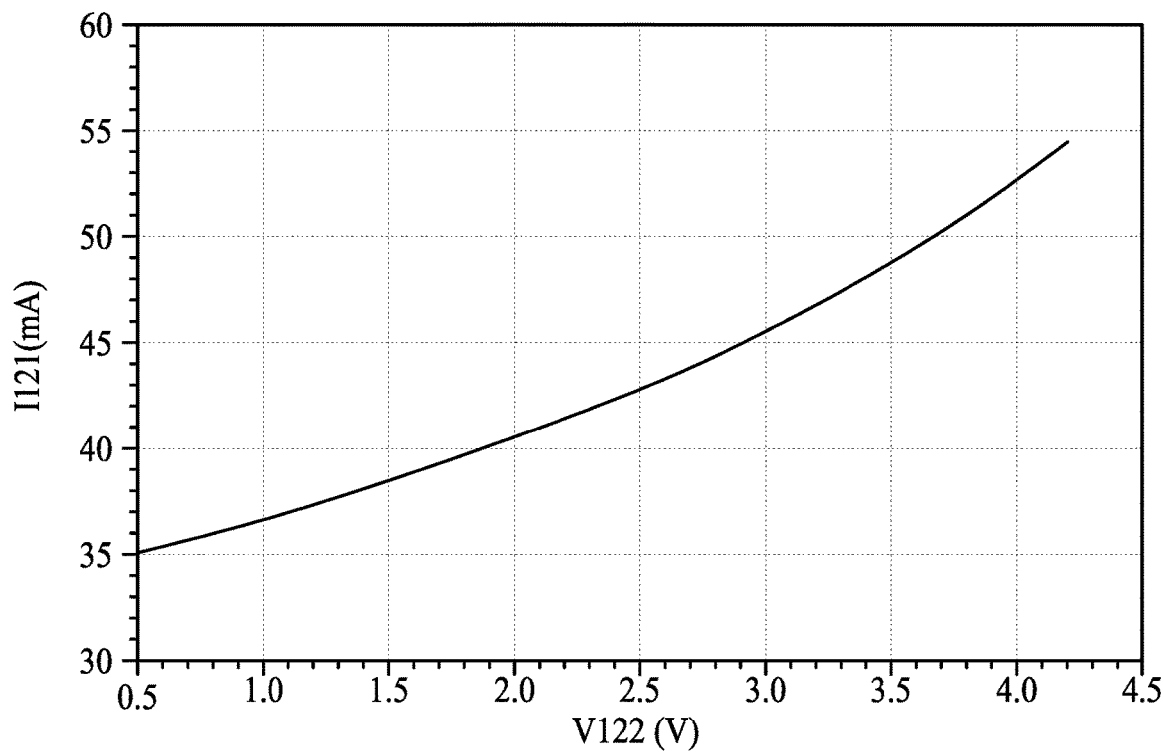

FIGS. 4B, 4C, 4D and 4E illustrate simulation results of the power amplifier 400 in FIG. 4A in accordance with some embodiments of the present disclosure. The electrical characteristics and the advantages of the power amplifier 400 are similar to those of the power amplifier 100 in FIG. 1A. For example, as shown in FIG. 4B, the current I121 continuously changes from 0 mA to about 45 mA as the voltage V111 continuously changes from 0 V to about 1 V. As shown in FIG. 4C, the current I121 remains at 49.5 mA as the voltage V121 continuously changes from 3.2 V to about 4.1 V. As shown in FIG. 4D, the current I121 changes between about 49.4 mA and about 49.7 mA as the temperature of the power amplifier 400 changes from about −20° C. to about 120° C. As shown in FIG. 4E, the current I121 continuously changes from 35 mA to about 55 mA as the voltage V122 continuously changes from 0.5 V to about 4.2 V.

Figure 5A:
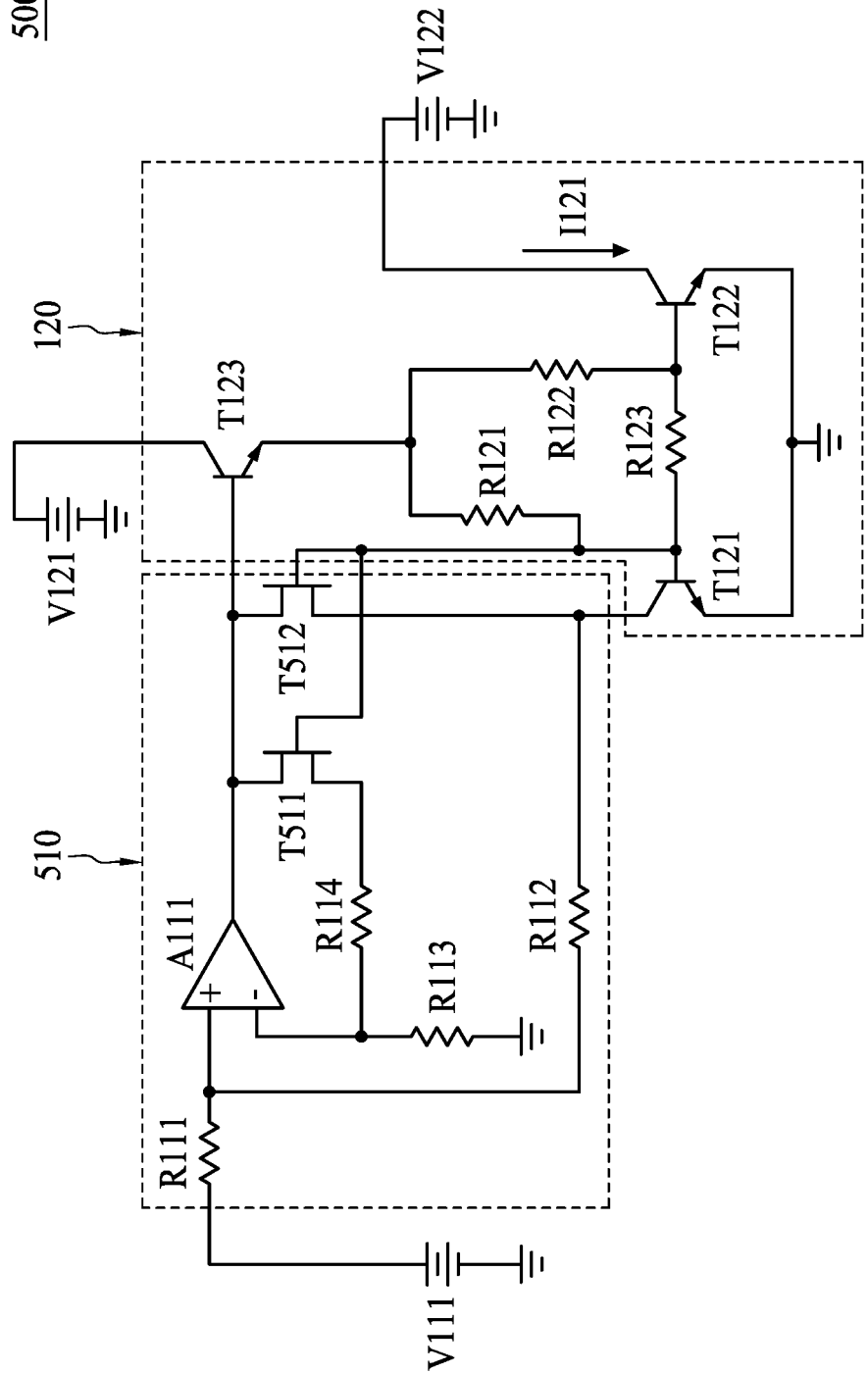
FIG. 5A is a schematic diagram illustrating a power amplifier in accordance with some embodiments of the present disclosure.
Figure 5B:
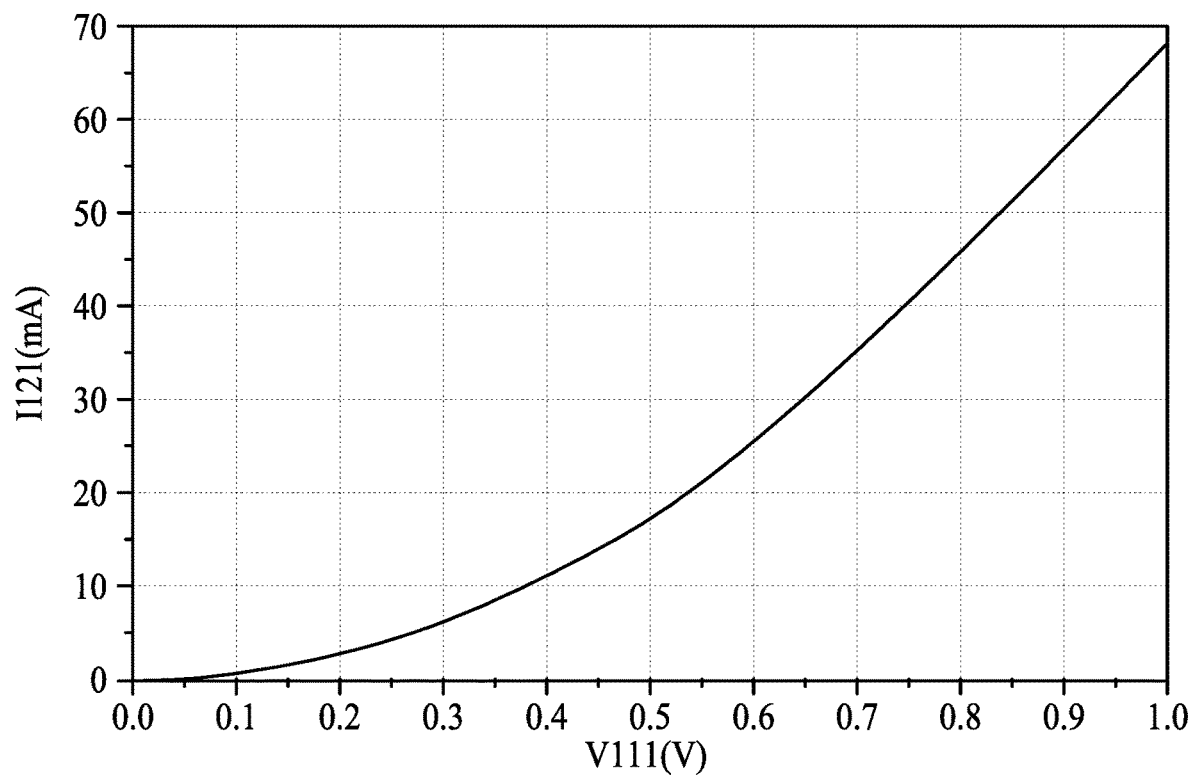
FIG. 5B, FIG. 5C, FIG. 5D and FIG. 5E illustrate simulation results of the power amplifier shown in FIG. 5A in accordance with some embodiments of the present disclosure.

FIG. 5A is a schematic diagram illustrating a power amplifier 500 in accordance with some embodiments of the present disclosure. The power amplifier 500 is similar to the power amplifier 100 in FIG. 1A, and one of the differences therebetween is that a voltage-controlled current source 510 of the power amplifier 500 further includes transistors T511 and T512. In some embodiments, the transistors T511 and T512 are depletion mode pHEMT (D-pHEMT). A gate of the transistor T511 and a gate of the transistor T512 are connected to the base of the transistor T121. A drain of the transistor T511 and a drain of the transistor T512 are connected to the output of the amplifier A111. A source of the transistor T511 of the resistor R114. A source of the transistor T512 of the resistor R112. Since the drains of the transistors T511 and T512 are connected to the same voltage and the gates of the transistors T511 and T512 are connected to the same voltage, the voltage difference between the source of the transistor T511 and the source of the transistor T512 is proportional to the voltage V111. In some embodiments, the transistor T511 can compensate the offset of threshold voltages of the transistors T511 and T512 if the resistors R111, R112, R113 and R114 are relative large. In some embodiments, the transistor T512 can generate current that is proportional to the square of the voltage V111. As shown in FIG. 5B, the current I121 also changes proportional to the square of the voltage V111. Therefore, the transistors T511 and T512 can act as a square device to increase the current range (or resolution) of the current I121.

Figure 5C:
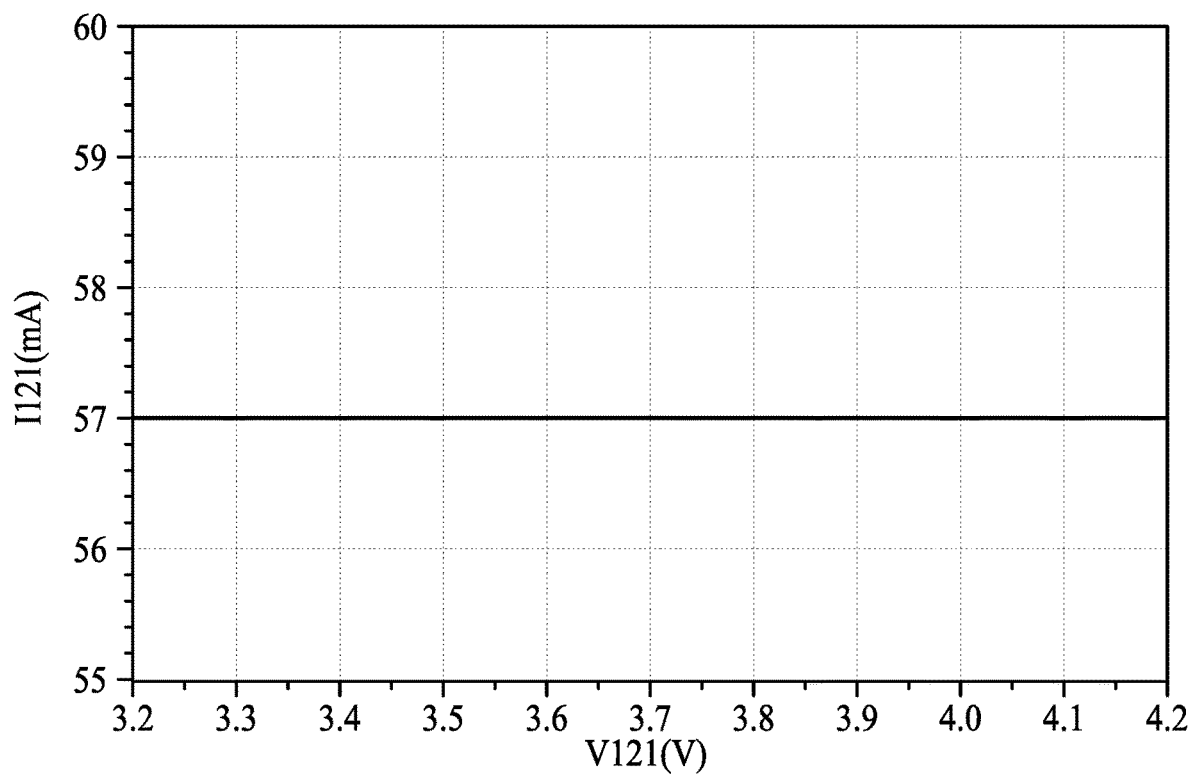
Figure 5D:
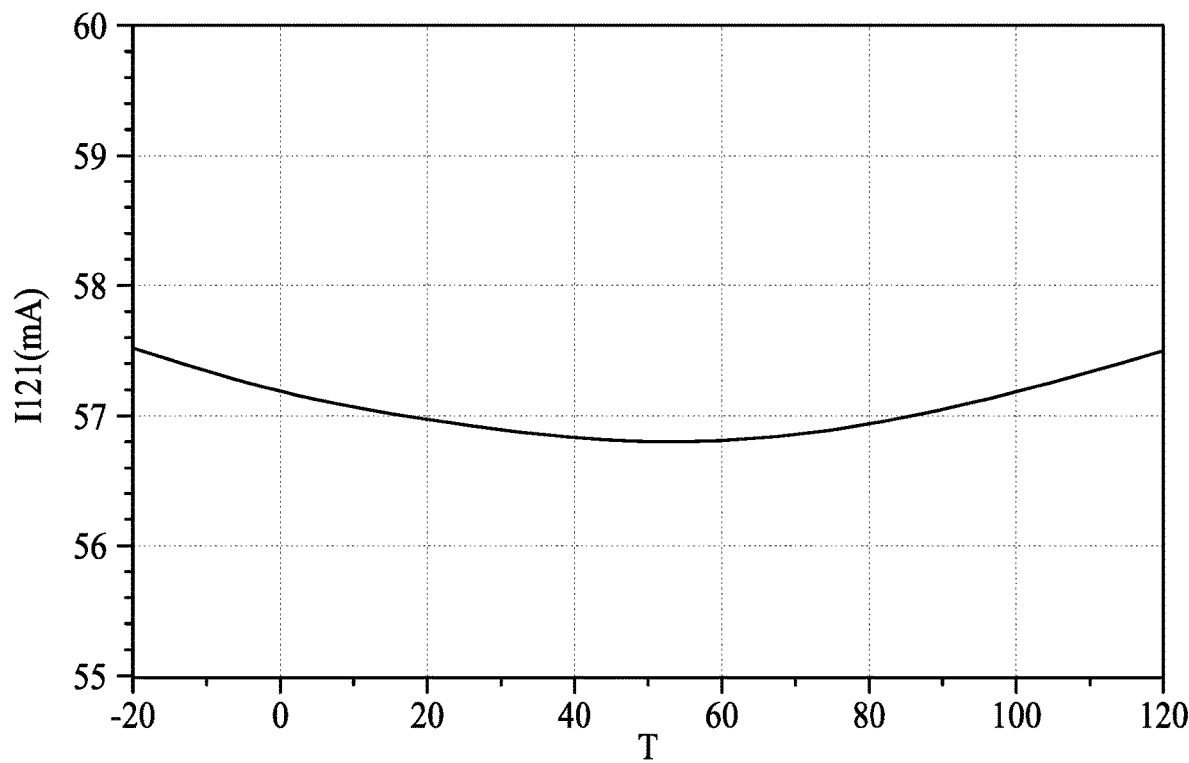
Figure 5E:
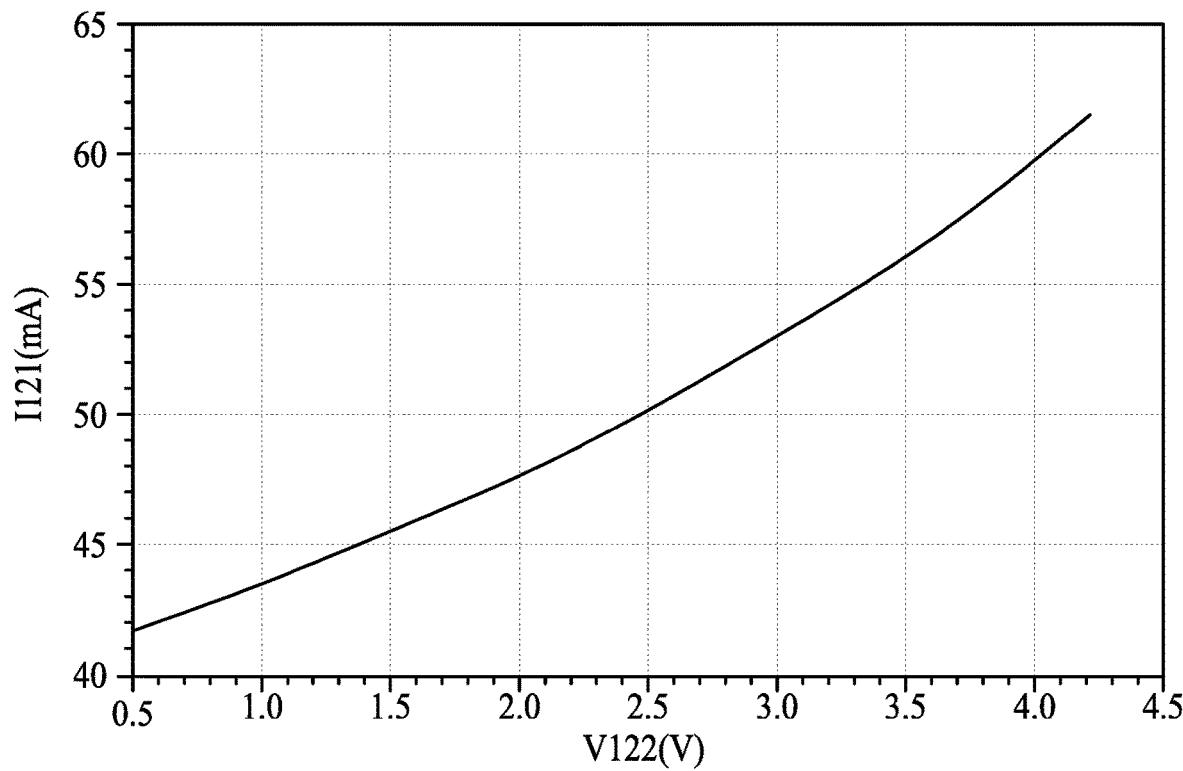

FIGS. 5B, 5C, 5D and 5E illustrate simulation results of the power amplifier 500 in FIG. 5A in accordance with some embodiments of the present disclosure. The electrical characteristics and the advantages of the power amplifier 500 are similar to those of the power amplifier 100 in FIG. 1A. For example, as shown in FIG. 5B, the current I121 continuously changes from 0 mA to about 70 mA as the voltage V111 continuously changes from 0 V to about 1 V. As shown in FIG. 5C, the current I121 remains at 57 mA as the voltage V121 continuously changes from 3.2 V to about 4.2 V. As shown in FIG. 5D, the current I121 changes between about 56.8 mA and about 57.6 mA as the temperature of the power amplifier 500 changes from about −20° C. to about 120° C. As shown in FIG. 5E, the current I121 continuously changes from 42 mA to about 64 mA as the voltage V122 continuously changes from 0.5 V to about 4.2 V.

Figure 6A:
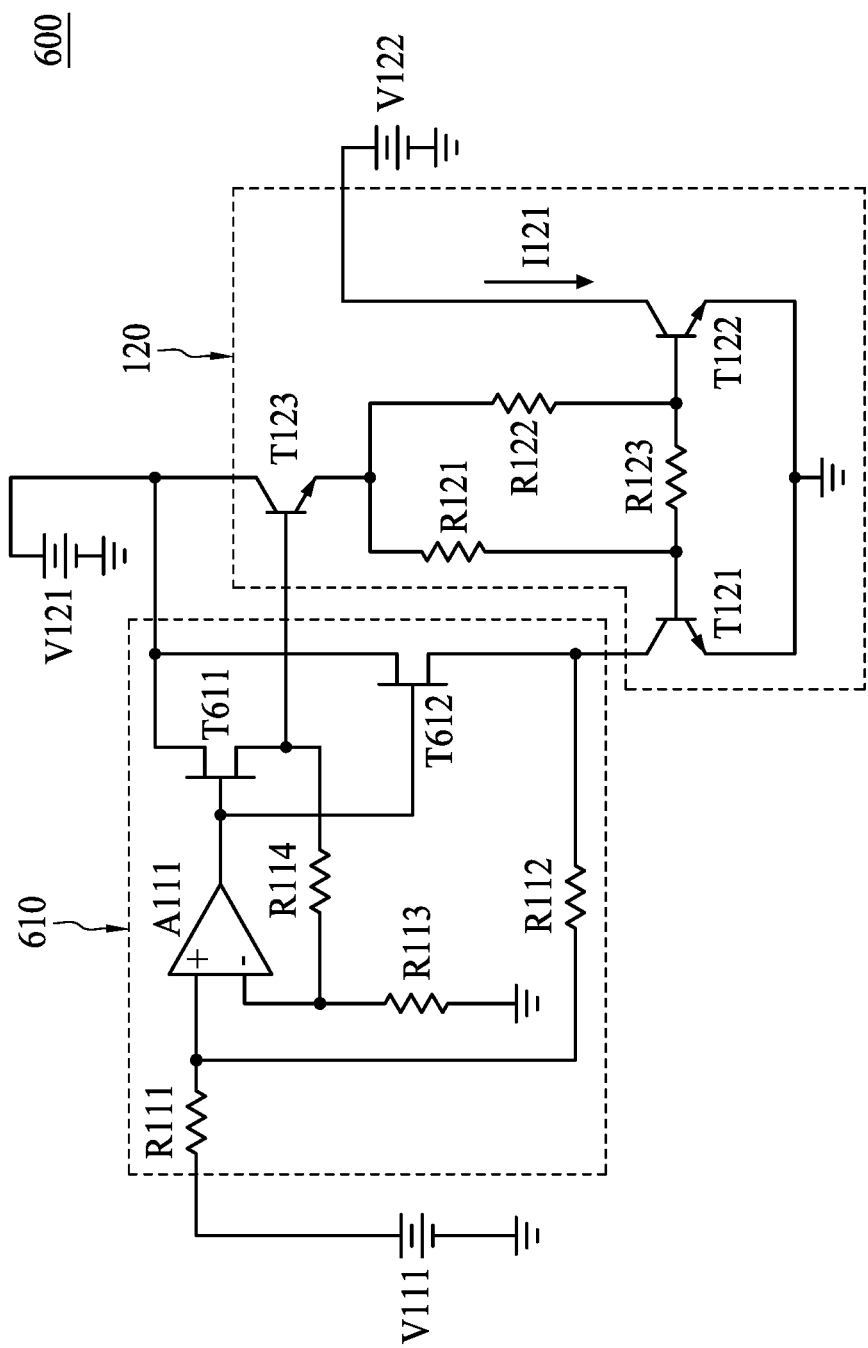
FIG. 6A is a schematic diagram illustrating a power amplifier in accordance with some embodiments of the present disclosure.

FIG. 6A is a schematic diagram illustrating a power amplifier 600 in accordance with some embodiments of the present disclosure. The power amplifier 600 is similar to the power amplifier 100 in FIG. 1A, and one of the differences therebetween is that a voltage-controlled current source 610 of the power amplifier 600 further includes transistors T611 and T612. In some embodiments, the transistors T611 and T612 are D-pHEMT. A gate of the transistor T611 and a gate of the transistor T612 are connected to the output of the amplifier A111. A drain of the transistor T611 and a drain of the transistor T612 are connected to the voltage source to receive the voltage V121. A source of the transistor T611 is connected to the resistor R114 and the base of the transistor T123. A source of the transistor T612 is connected to the resistor R112 and the collector of the transistor T111. The transistors T611 and T612 can act as buffers to reduce the current and the voltage of the output of the amplifier A111.

Figure 6B:
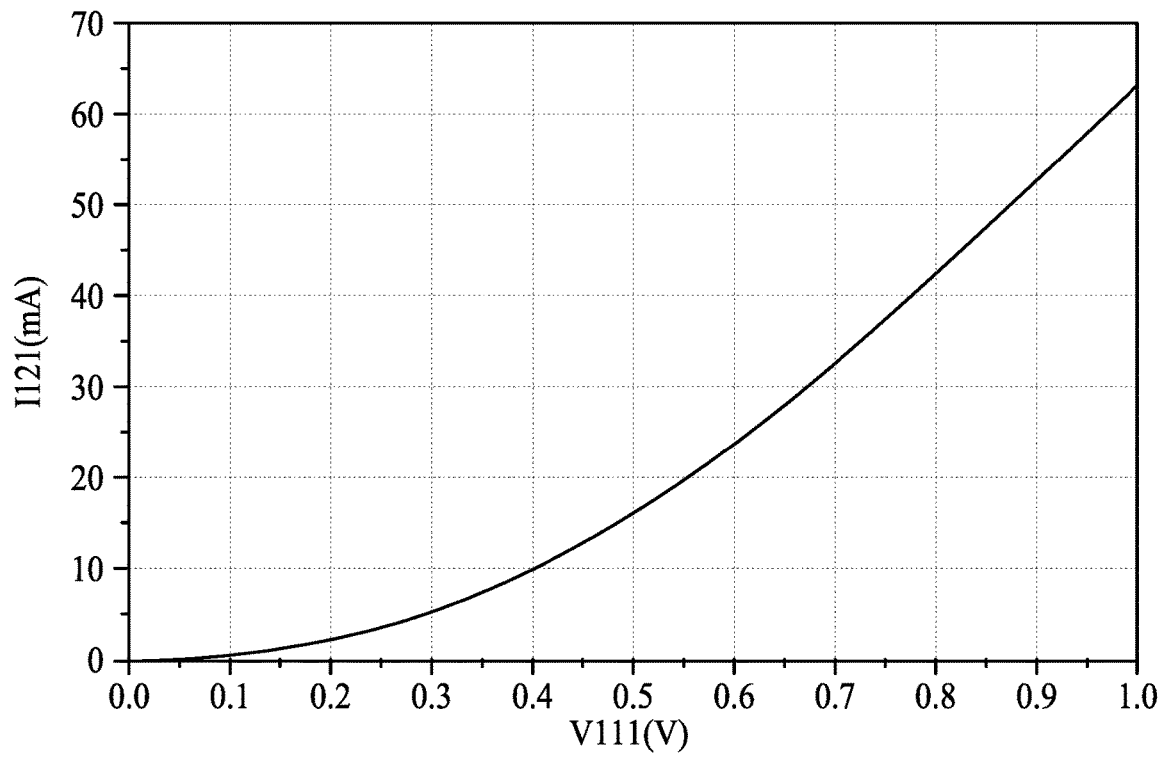
FIG. 6B, FIG. 6C, FIG. 6D and FIG. 6E illustrate simulation results of the power amplifier shown in FIG. 6A in accordance with some embodiments of the present disclosure.
Figure 6C:
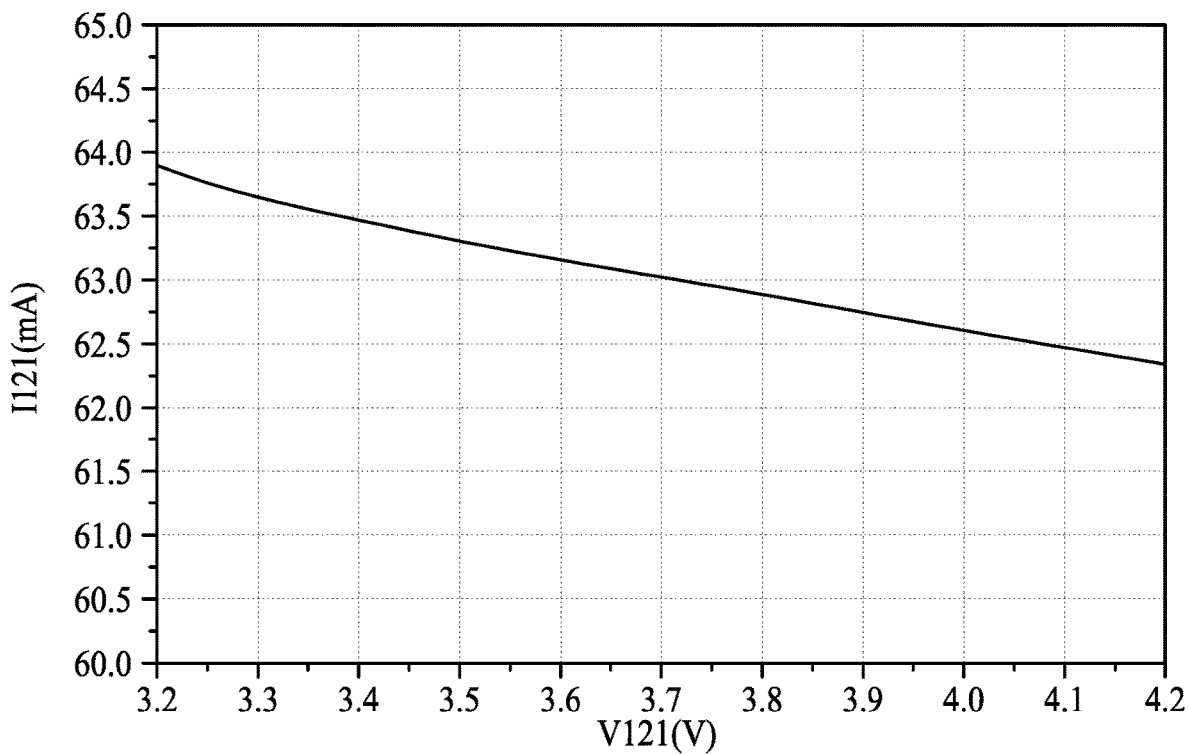
Figure 6D:
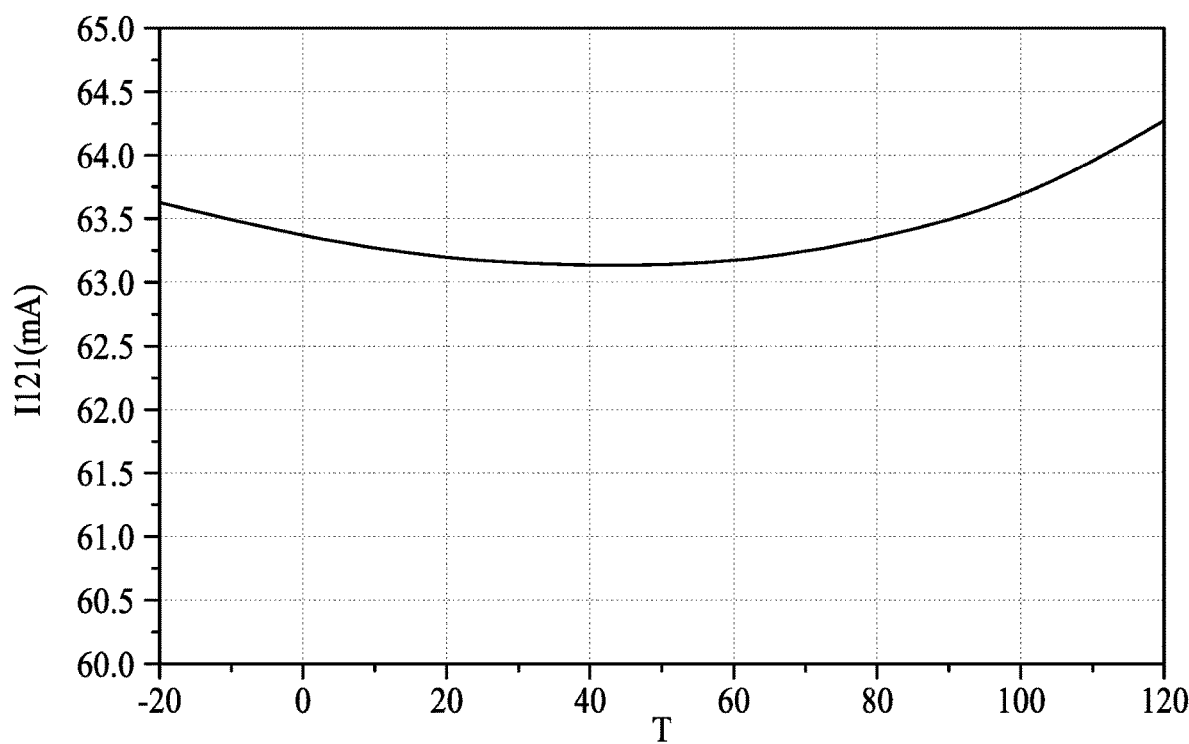
Figure 6E:
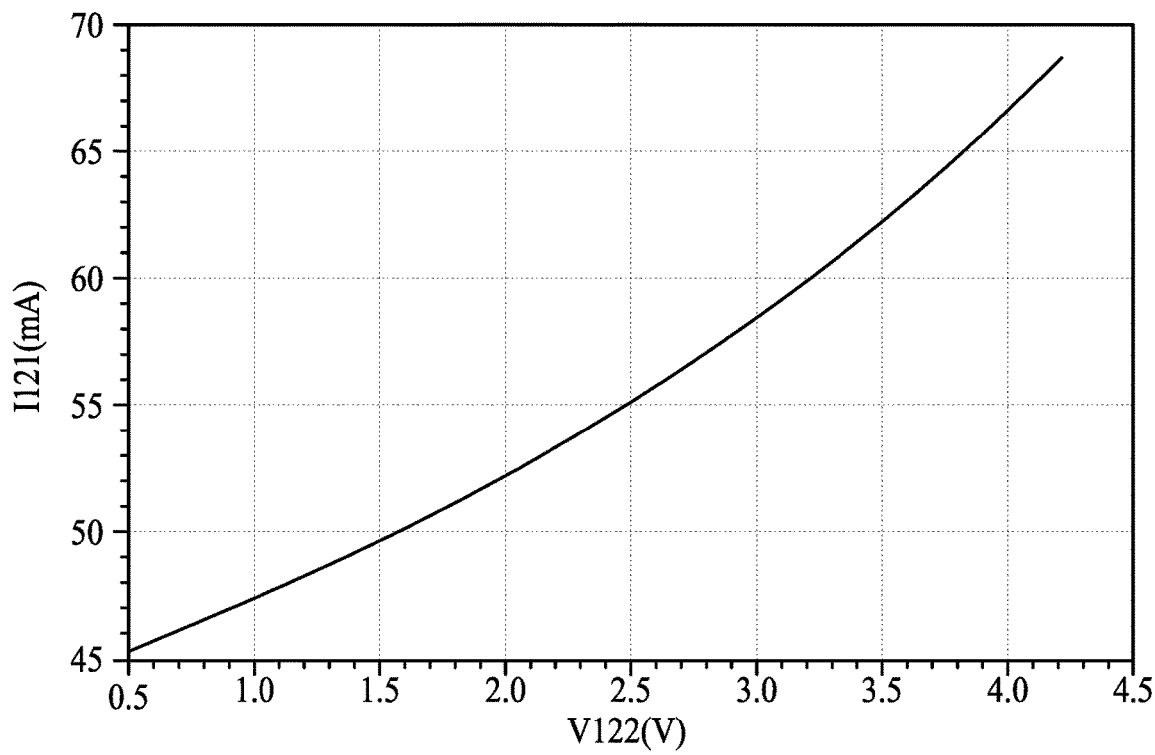

FIGS. 6B, 6C, 6D and 6E illustrate simulation results of the power amplifier 600 in FIG. 6A in accordance with some embodiments of the present disclosure. The electrical characteristics and the advantages of the power amplifier 600 are similar to those of the power amplifier 100 in FIG. 1A. For example, as shown in FIG. 6B, the current I121 continuously changes from 0 mA to about 62 mA as the voltage V111 continuously changes from 0 V to about 1 V. As shown in FIG. 6B, the current I121 changes proportional to the square of the voltage V111. Therefore, the transistors T611 and T612 can act as a square device to increase the current range (or resolution) of the current I121. As shown in FIG. 6C, the current I121 changes between about 62.5 mA and about 64 mA as the voltage V121 continuously changes from 3.2 V to about 4.2 V. As shown in FIG. 6D, the current I121 changes between about 63 mA and about 64.3 mA as the temperature of the power amplifier 600 changes from about −20° C. to about 120° C. As shown in FIG. 6E, the current I121 continuously changes from 45 mA to about 68 mA as the voltage V122 continuously changes from 0.5 V to about 4.2 V. In other embodiments, the transistors T511 and T512 can be replaced by enhanced mode pHEMT (E-pHEMT) to increase the current I121. For example, the current I121 can continuously changes from 0 mA to about 160 mA as the voltage V111 continuously changes from 0 V to about 1 V.

Figure 7A:
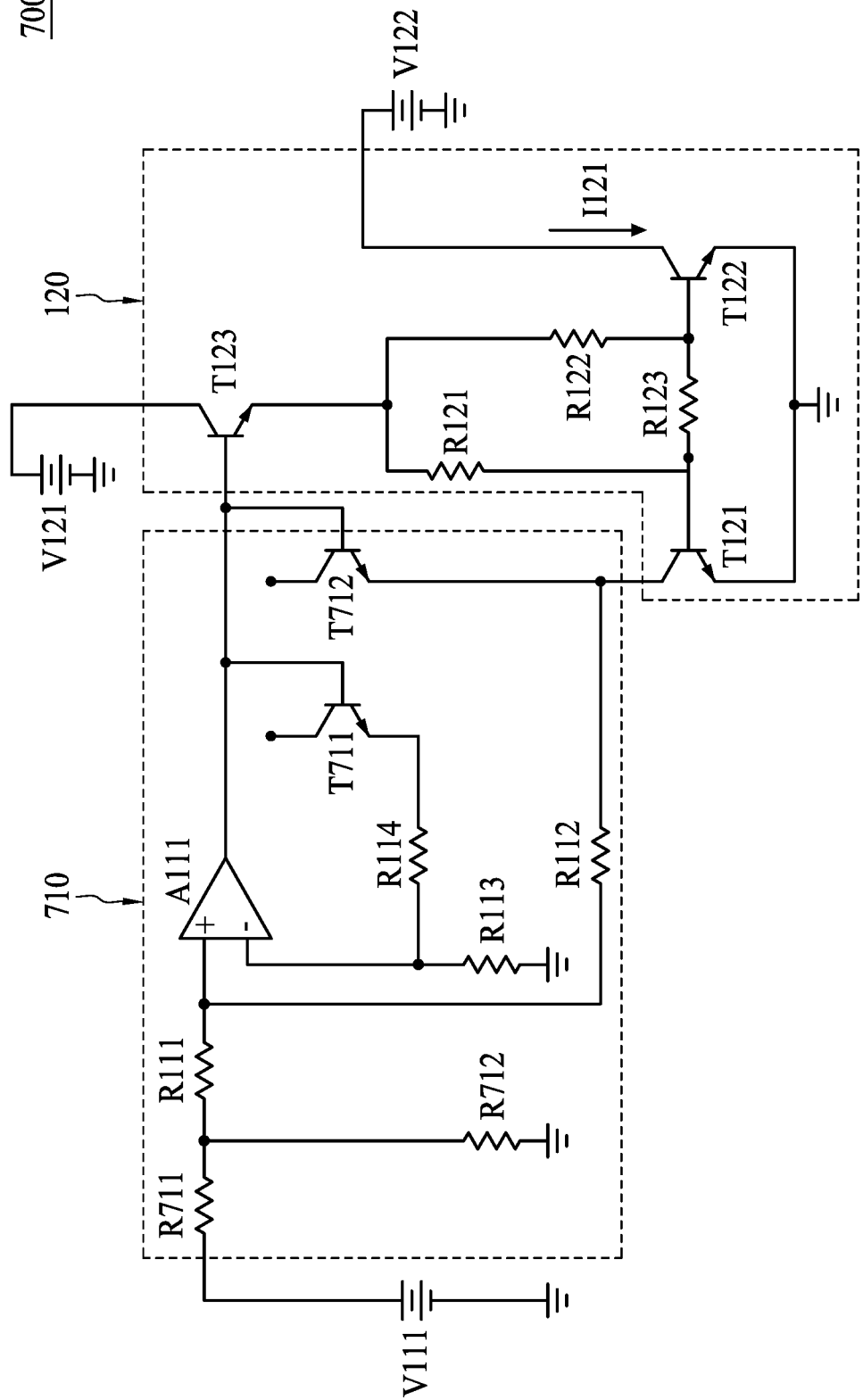
FIG. 7A is a schematic diagram illustrating a power amplifier in accordance with some embodiments of the present disclosure.

FIG. 7A is a schematic diagram illustrating a power amplifier 700 in accordance with some embodiments of the present disclosure. The power amplifier 700 is similar to the power amplifier 100 in FIG. 1A, and one of the differences therebetween is that a voltage-controlled current source 710 of the power amplifier 700 further includes transistors T711 and T712 and resistors R711 and R712. In some embodiments, the transistors T711 and T712 are diodes or diode-connected transistors (e.g., heterojunction bipolar transistors (HBT)). A base of the transistor T711 and a base of the transistor T712 are connected to the output of the amplifier A111 and the base of the transistor T123. A collector of the transistor T711 and a collector of the transistor T712 are open. An emitter of the transistor T711 is connected to the resistor R114. An emitter of the transistor T712 is connected to the resistor R112 and the collector of the transistor T111. The resistor R711 is connected between the voltage source providing the voltage V111 and the resistor R111. The resistor R712 is connected between the resistor R711 and ground.

Figure 7B:
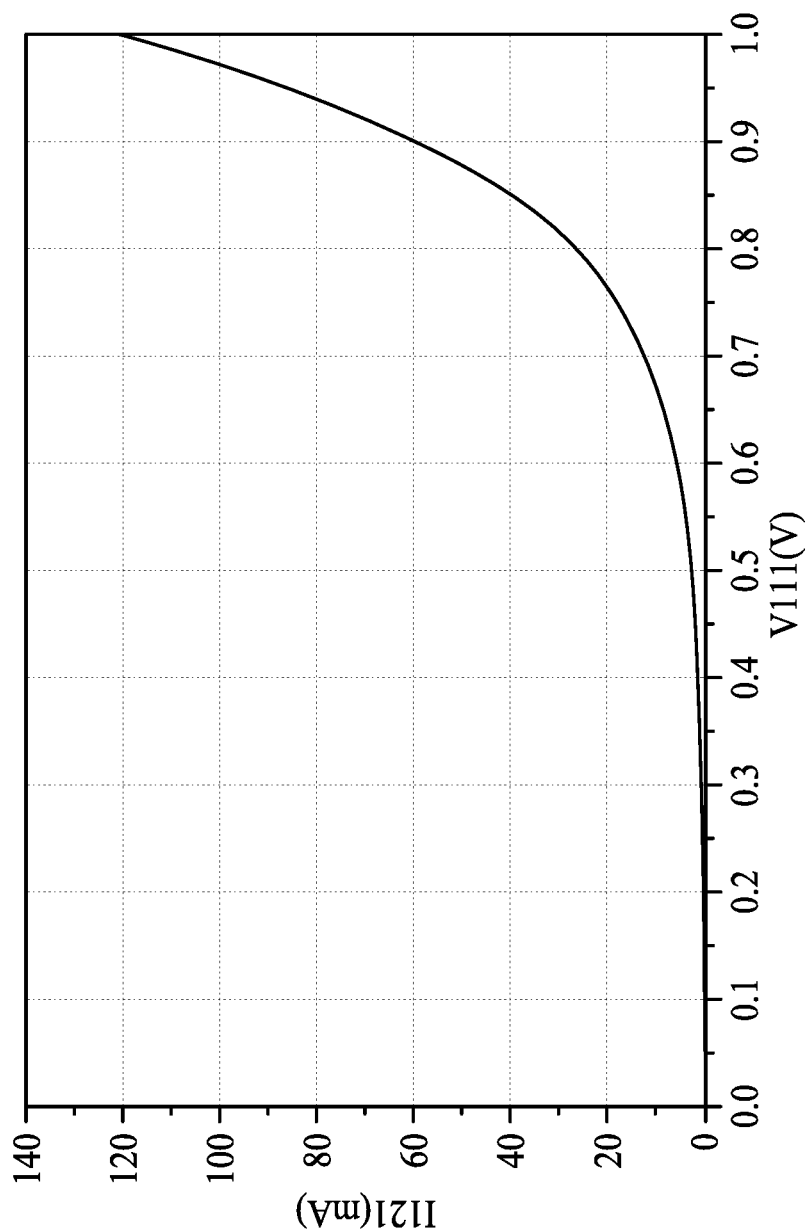
FIG. 7B illustrates a simulation result of the power amplifier shown in FIG. 7A in accordance with some embodiments of the present disclosure.

FIG. 7B illustrates a simulation result of the power amplifier 700 in FIG. 7A in accordance with some embodiments of the present disclosure. The electrical characteristics and the advantages of the power amplifier 700 are similar to those of the power amplifier 100 in FIG. 1A. For example, as shown in FIG. 7B, the current I121 continuously changes from 0 mA to about 120 mA as the voltage V111 continuously changes from 0 V to about 1 V. As shown in FIG. 7B, the current I121 exponentially increases as the voltage V111 increases. Therefore, the transistors T611 and T612 can act as an exponential device to increase the current range (or resolution) of the current I121.

Figure 8A:
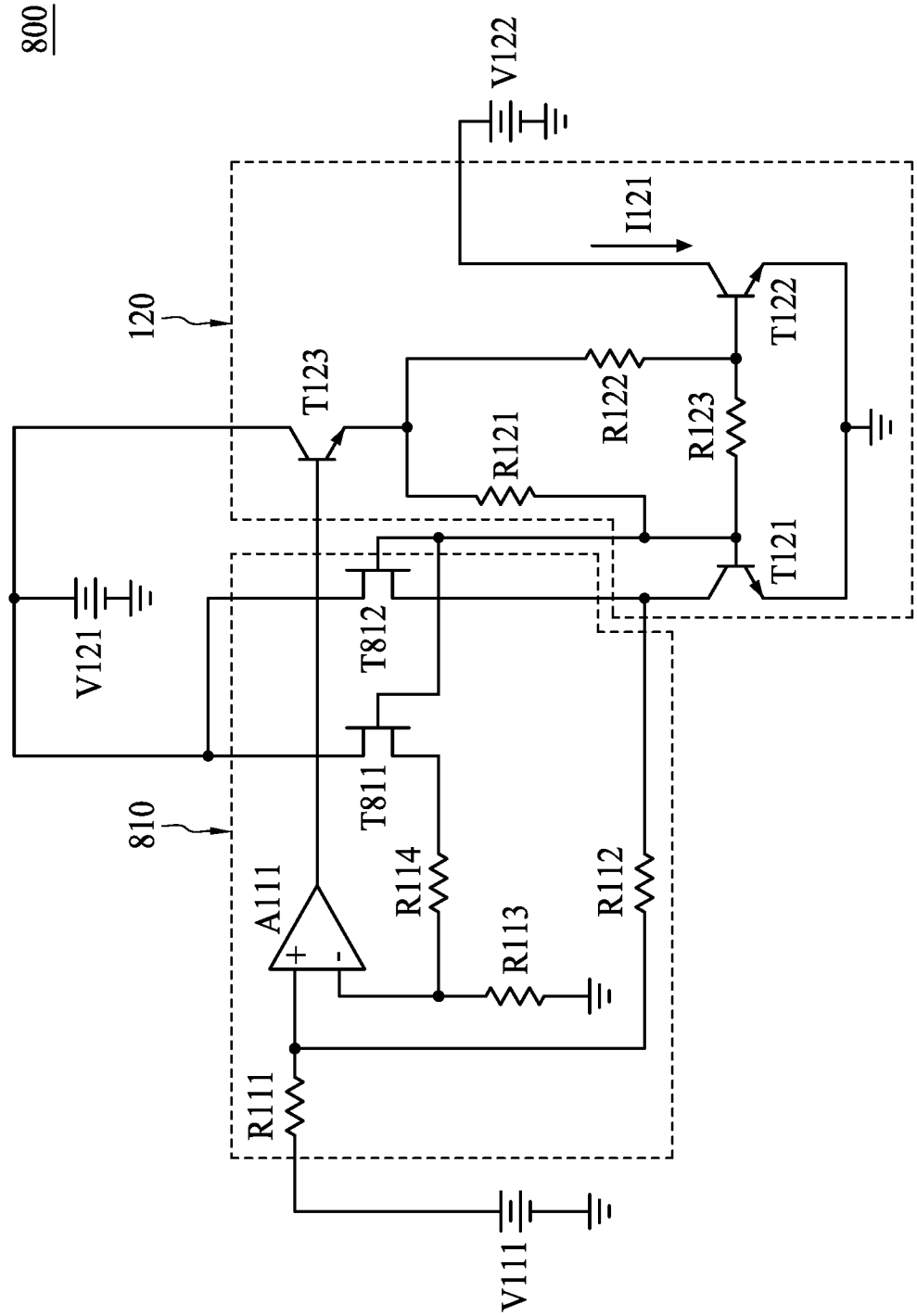
FIG. 8A is a schematic diagram illustrating a power amplifier in accordance with some embodiments of the present disclosure.

FIG. 8A is a schematic diagram illustrating a power amplifier 800 in accordance with some embodiments of the present disclosure. The power amplifier 800 is similar to the power amplifier 100 in FIG. 1A, and one of the differences therebetween is that a voltage-controlled current source 810 of the power amplifier 800 further includes transistors T811 and T812. In some embodiments, the transistors T811 and T812 are D-pHEMT. A gate of the transistor T811 and a gate of the transistor T812 are connected to the base of the transistor T111. A drain of the transistor T811 and a drain of the transistor T812 are connected to the voltage source to receive the voltage V121. A source of the transistor T811 is connected to the resistor R114. A source of the transistor T812 is connected to the resistor R112 and the collector of the transistor T111. The arrangements of the transistors T811 and T812 can further reduce the current at the output of the amplifier 111.

Figure 8B:
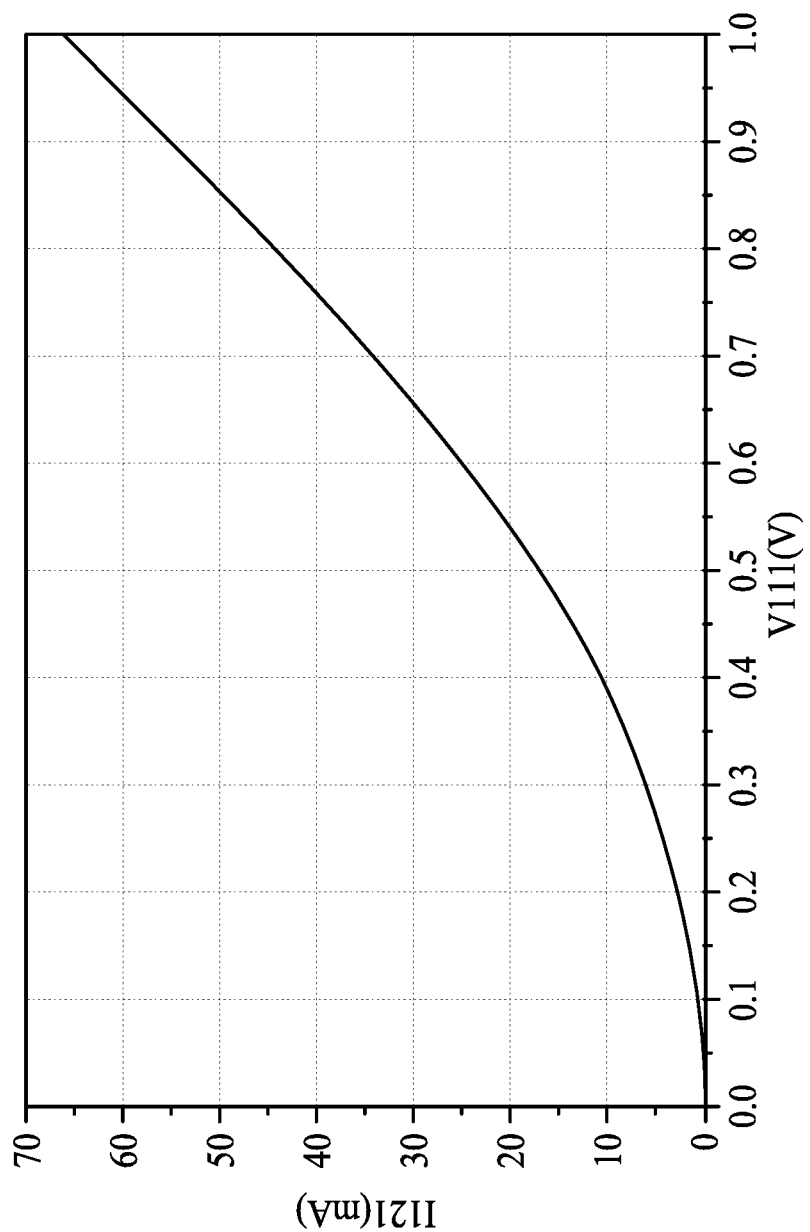
FIG. 8B illustrates a simulation result of the power amplifier shown in FIG. 8A in accordance with some embodiments of the present disclosure.

FIG. 8B illustrates a simulation result of the power amplifier 800 in FIG. 8A in accordance with some embodiments of the present disclosure. The electrical characteristics and the advantages of the power amplifier 800 are similar to those of the power amplifier 100 in FIG. 1A. For example, as shown in FIG. 8B, the current I121 continuously changes from 0 mA to about 65 mA as the voltage V111 continuously changes from 0 V to about 1 V.

Figure 9A:
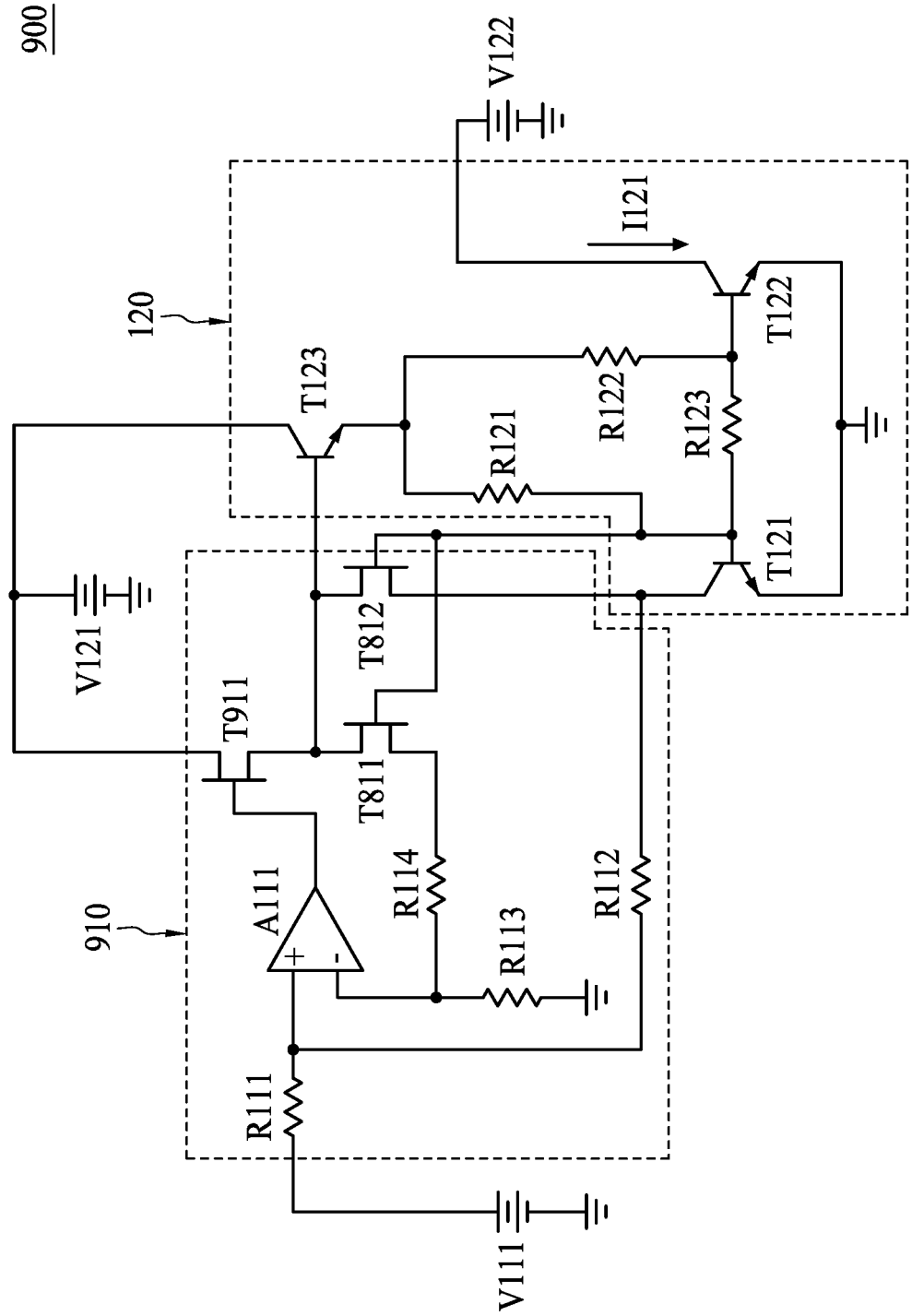
FIG. 9A is a schematic diagram illustrating a power amplifier in accordance with some embodiments of the present disclosure.

FIG. 9A is a schematic diagram illustrating a power amplifier 900 in accordance with some embodiments of the present disclosure. The power amplifier 900 is similar to the power amplifier 800 in FIG. 8A, and one of the differences therebetween is that a voltage-controlled current source 910 of the power amplifier 900 further includes a transistor T911. In some embodiments, the transistor T911 is D-pHEMT. A gate of the transistor T911 is connected to the output of the amplifier A111. A drain of the transistor T911 is connected to the voltage source to receive the voltage V121. A source of the transistor T911 is connected to the drain of the transistor T811 and the drain of the transistor T812. The transistor T911 can act as a buffer to reduce the current and voltage at the output of the amplifier A111.

Figure 9B:
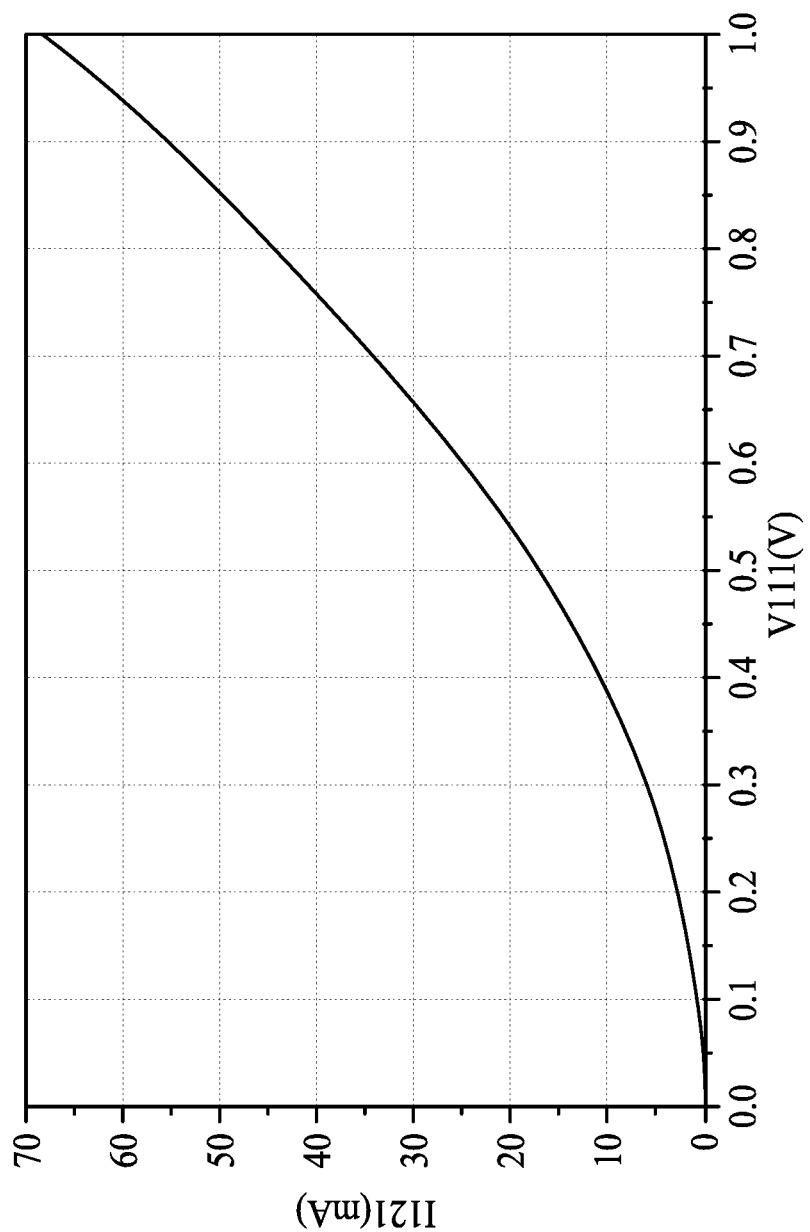
FIG. 9B illustrates a simulation result of the power amplifier shown in FIG. 9A in accordance with some embodiments of the present disclosure.

FIG. 9B illustrates a simulation result of the power amplifier 900 in FIG. 9A in accordance with some embodiments of the present disclosure. The electrical characteristics and the advantages of the power amplifier 900 are similar to those of the power amplifier 800 in FIG. 8A. For example, as shown in FIG. 9B, the current I121 continuously changes from 0 mA to about 68 mA as the voltage V111 continuously changes from 0 V to about 1 V.

Figure 10A:
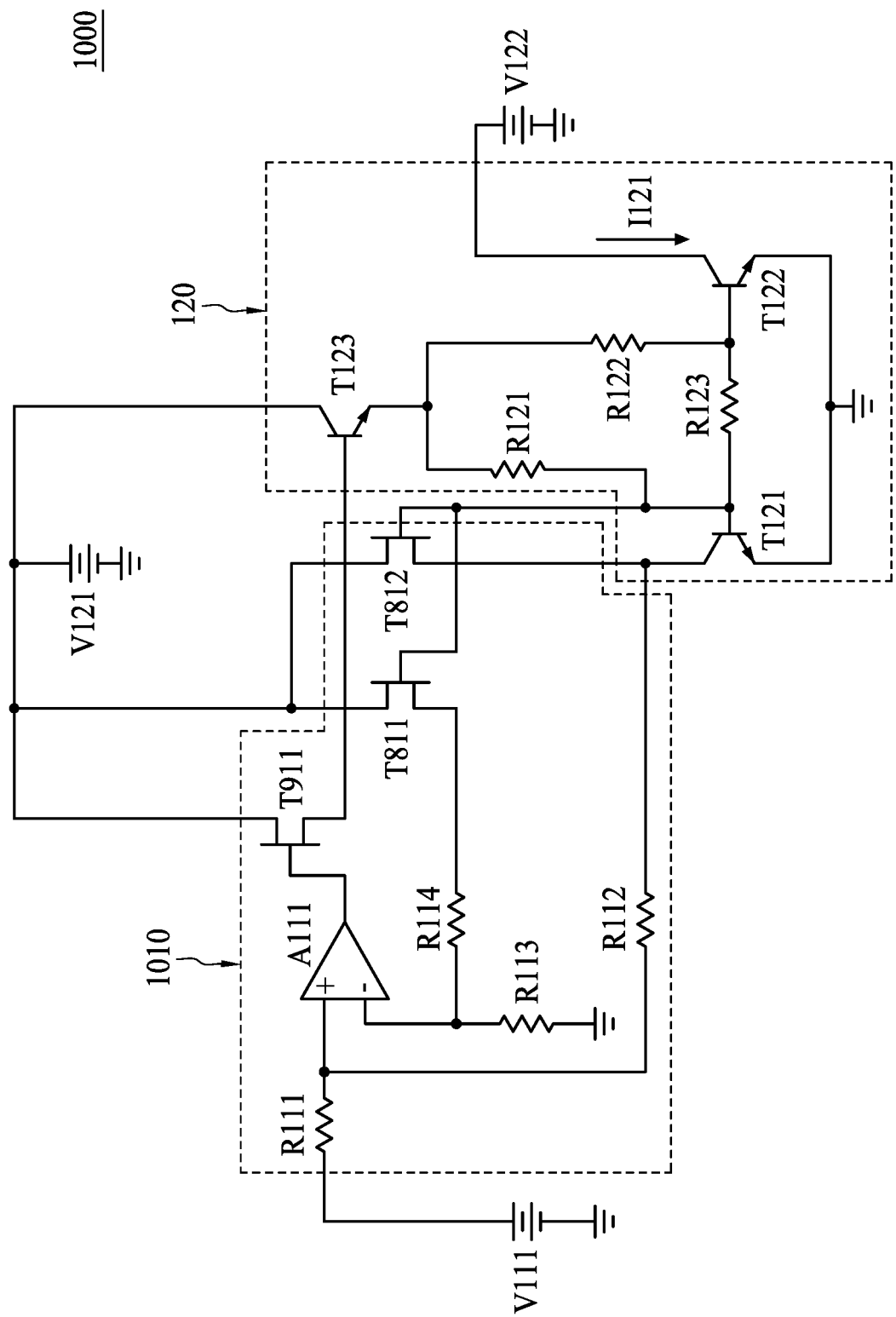
FIG. 10A is a schematic diagram illustrating a power amplifier in accordance with some embodiments of the present disclosure.

FIG. 10A is a schematic diagram illustrating a power amplifier 1000 in accordance with some embodiments of the present disclosure. The power amplifier 1000 is similar to the power amplifier 900 in FIG. 9A, and one of the differences therebetween is that the connection relationship between the transistors T811, T812 and T911 of a voltage-controlled current source 1010 of the power amplifier 1000 is different from that of the voltage-controlled current source 910. For example, in the voltage-controlled current source 910, the source of the transistor T911 is connected to the drain of the transistor T811 and the transistor T812 while in the voltage-controlled current source 1010, the source of the transistor T911 is connected to the base of the transistor T123.

Figure 10B:
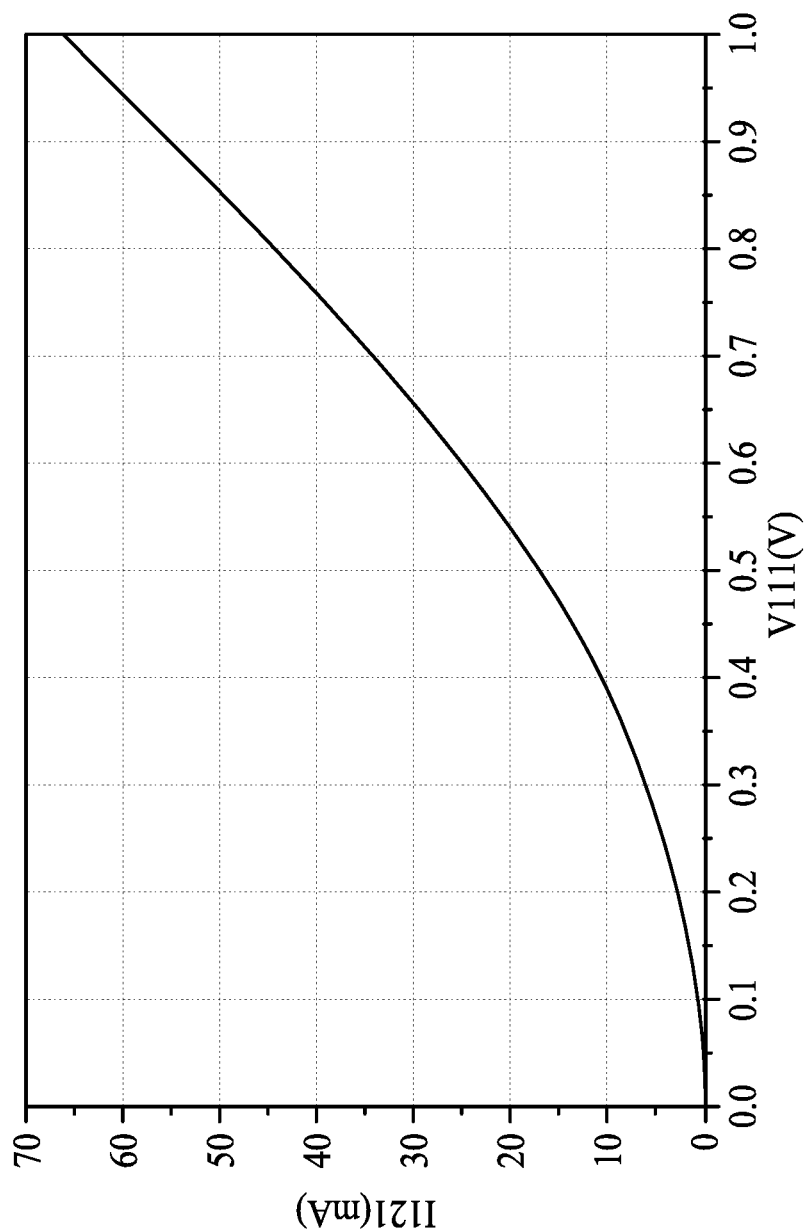
FIG. 10B illustrates a simulation result of the power amplifier shown in FIG. 10A in accordance with some embodiments of the present disclosure.

FIG. 10B illustrates a simulation result of the power amplifier 1000 in FIG. 10A in accordance with some embodiments of the present disclosure. The electrical characteristics and the advantages of the power amplifier 1000 are similar to those of the power amplifier 900 in FIG. 9A. For example, as shown in FIG. 10B, the current I121 continuously changes from 0 mA to about 65 mA as the voltage V111 continuously changes from 0 V to about 1 V.

Figure 11A:
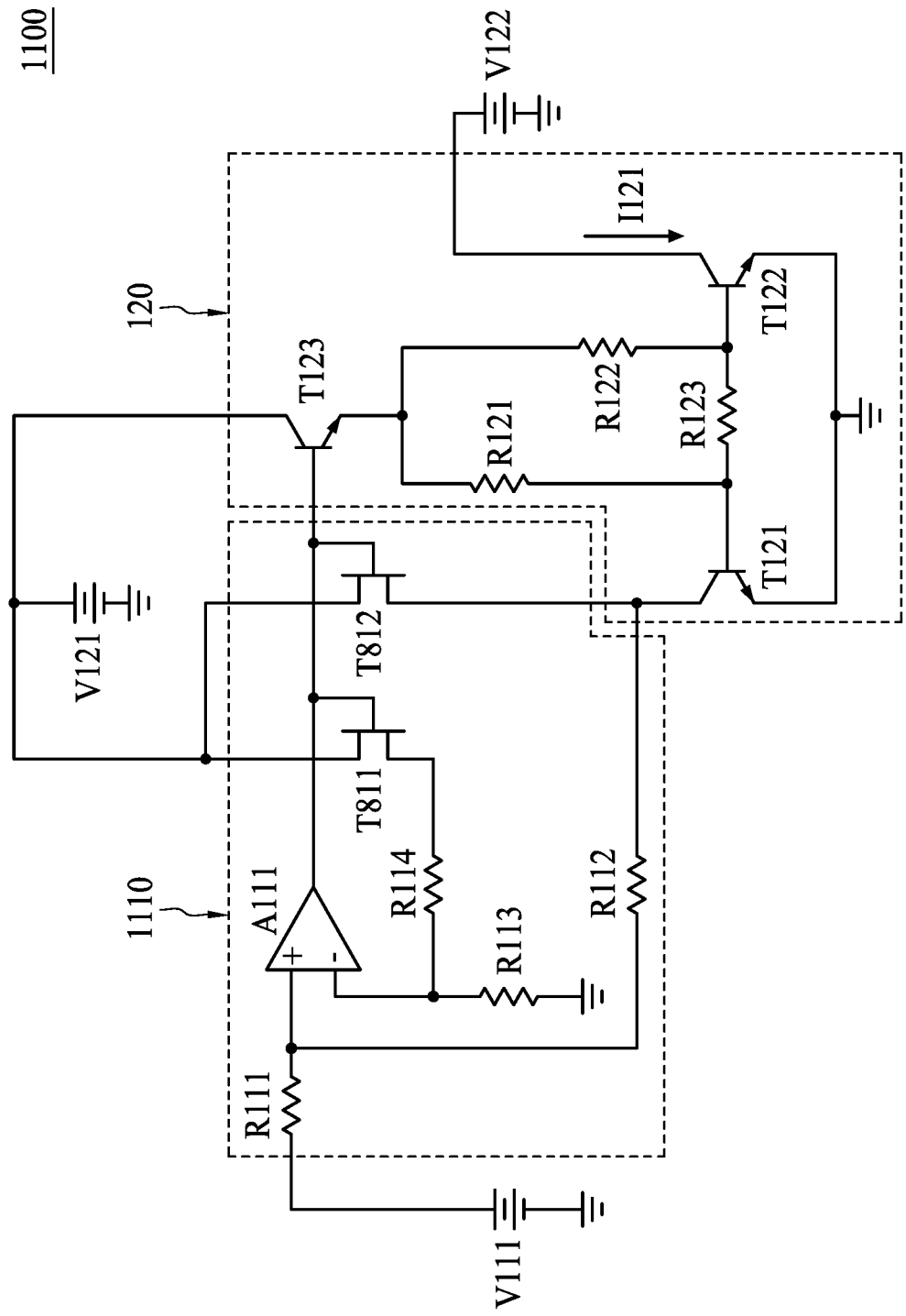
FIG. 11A is a schematic diagram illustrating a power amplifier in accordance with some embodiments of the present disclosure.

FIG. 11A is a schematic diagram illustrating a power amplifier 1100 in accordance with some embodiments of the present disclosure. The power amplifier 1100 is similar to the power amplifier 800 in FIG. 8A, and one of the differences therebetween is that the connection relationship between the transistors T811 and T812 of a voltage-controlled current source 1110 of the power amplifier 1100 is different from that of the voltage-controlled current source 810. In addition, in FIG. 11A, the transistors T811 and T812 can be E-pHEMT. The gate of the transistor T811 and the gate of the transistor T812 are connected to the output of the amplifier A111 and the base of the transistor T123. The drain of the transistor T811 and the drain of the transistor T812 are connected to the voltage source to receive the voltage V121. The source of the transistor T811 is connected to the resistor R114. The source of the transistor T812 is connected to the resistor R112 and the collector of the transistor T111.

Figure 11B:
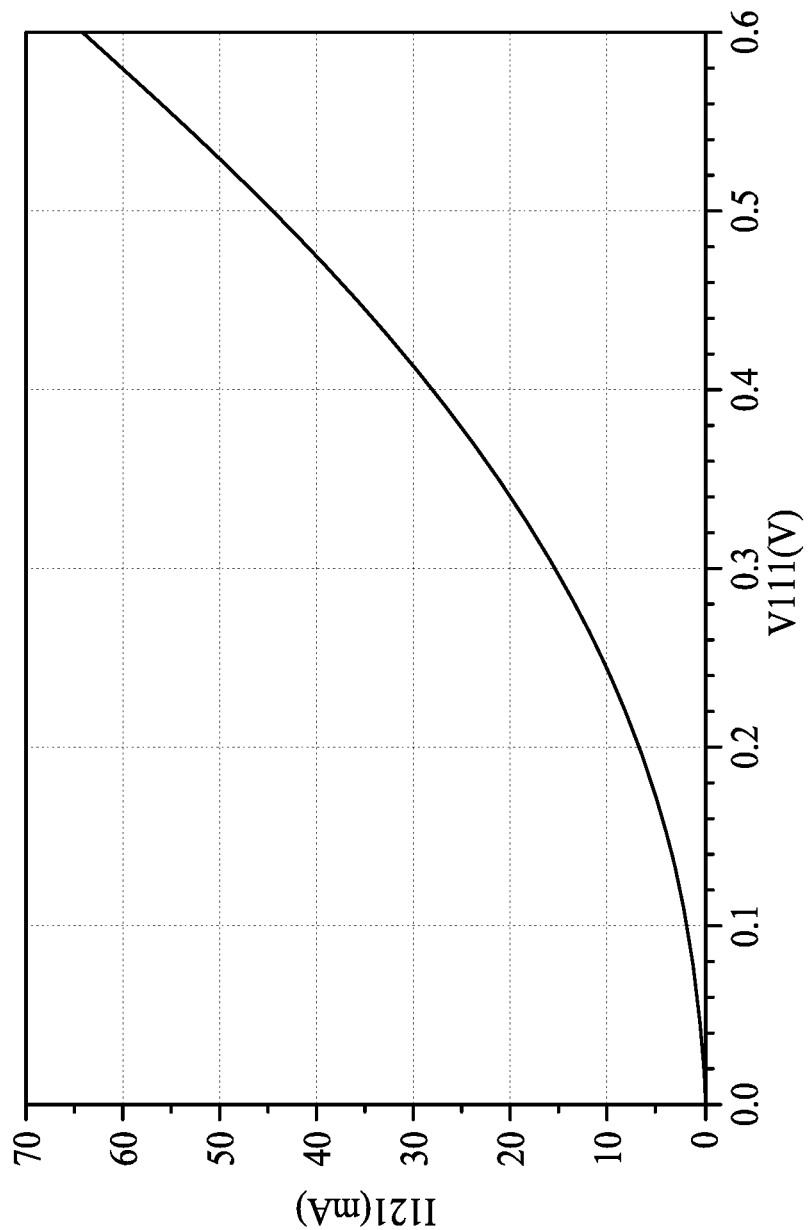
FIG. 11B illustrates a simulation result of the power amplifier shown in FIG. 11A in accordance with some embodiments of the present disclosure.

FIG. 11B illustrates a simulation result of the power amplifier 1100 in FIG. 11A in accordance with some embodiments of the present disclosure. The electrical characteristics and the advantages of the power amplifier 1100 are similar to those of the power amplifier 800 in FIG. 8A. For example, as shown in FIG. 11B, the current I121 continuously changes from 0 mA to about 65 mA as the voltage V111 continuously changes from 0 V to about 0.6 V.

Figure 12A:
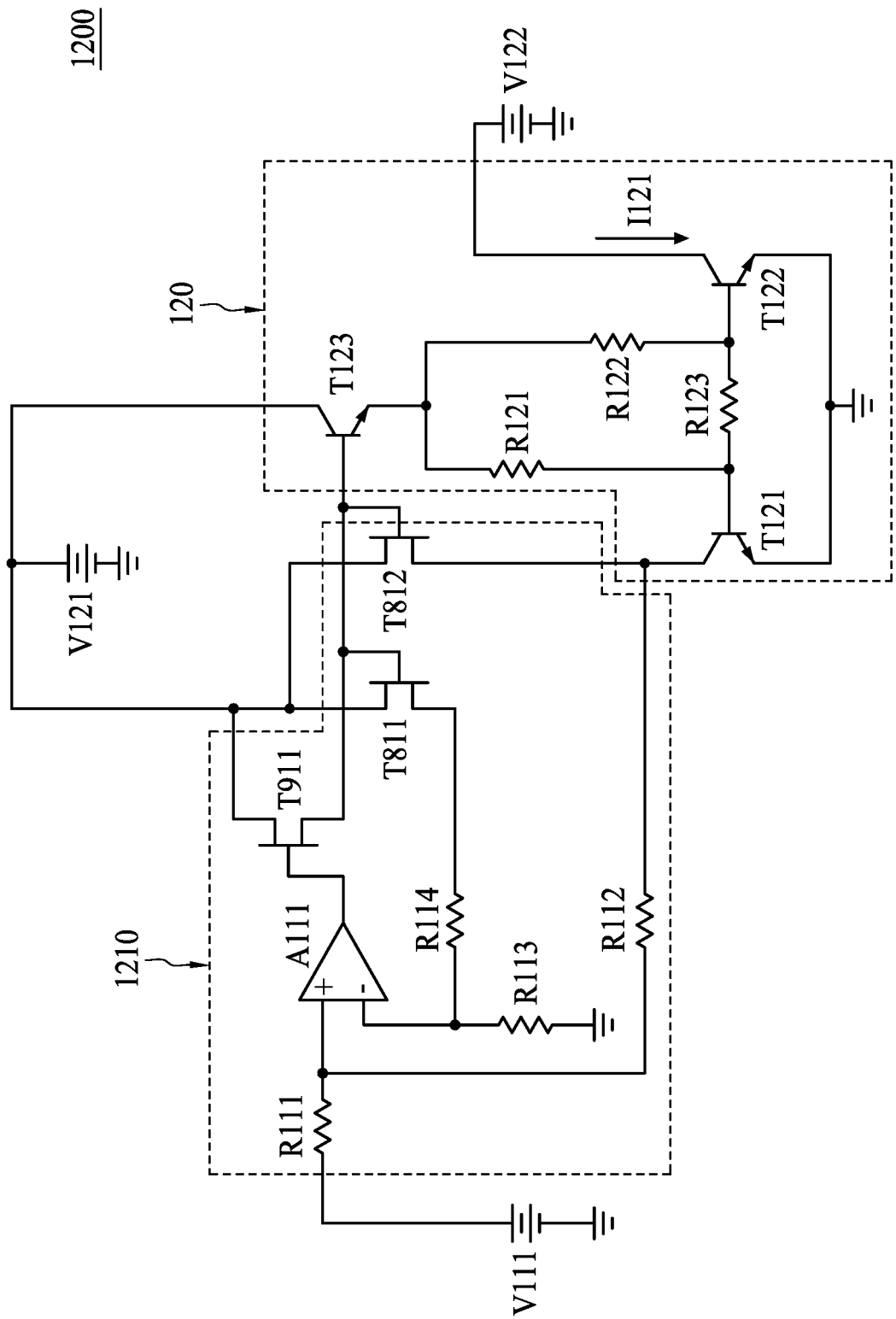
FIG. 12A is a schematic diagram illustrating a power amplifier in accordance with some embodiments of the present disclosure.

FIG. 12A is a schematic diagram illustrating a power amplifier 1200 in accordance with some embodiments of the present disclosure. The power amplifier 1200 is similar to the power amplifier 1000 in FIG. 10A, and one of the differences therebetween is that the connection relationship between the transistors T811, T812 and T911 of a voltage-controlled current source 1210 of the power amplifier 1200 is different from that of the voltage-controlled current source 1010. In addition, in FIG. 12A, the transistors T811, T812 and T911 can be E-pHEMT. The gate of the transistor T811 and the gate of the transistor T812 are connected to the source of the transistor T911 and the base of the transistor T123. The drain of the transistor T811 and the drain of the transistor T812 are connected to the voltage source to receive the voltage V121. The source of the transistor T811 is connected to the resistor R114. The source of the transistor T812 is connected to the resistor R112 and the collector of the transistor T111.

Figure 12B:
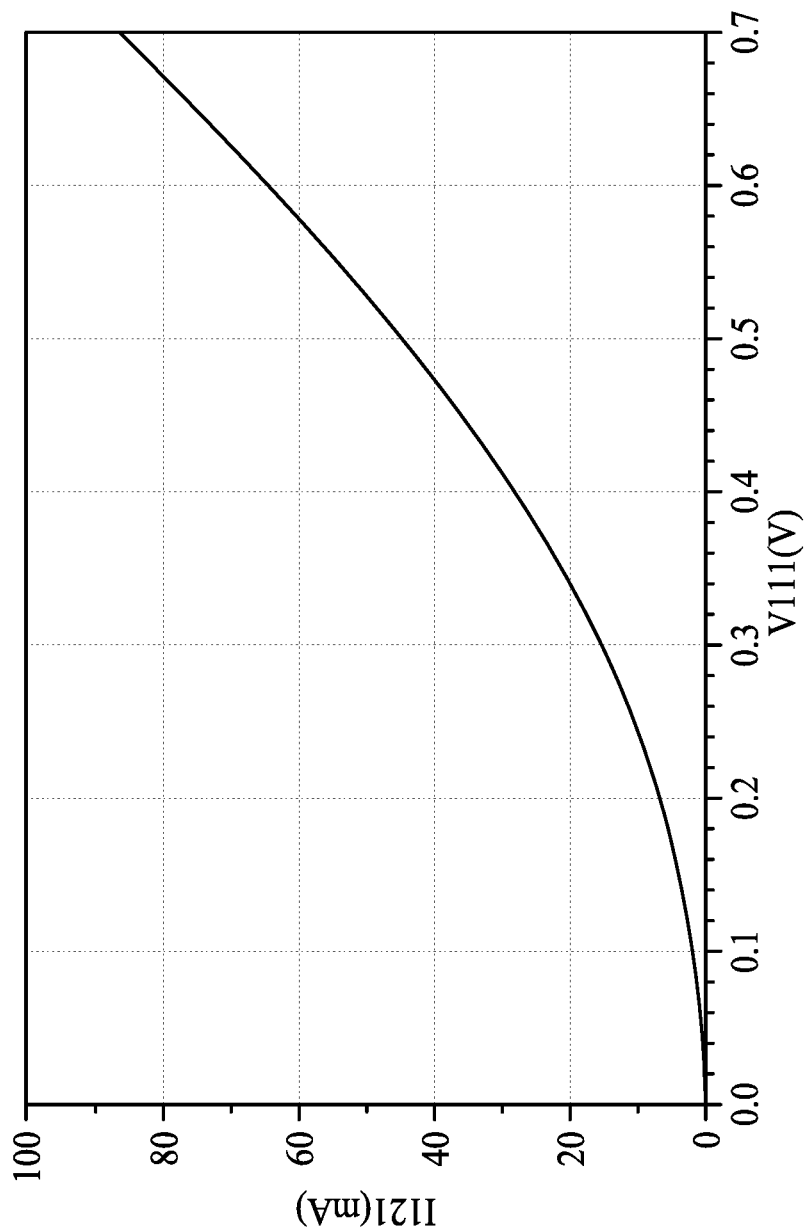
FIG. 12B illustrates a simulation result of the power amplifier shown in FIG. 12A in accordance with some embodiments of the present disclosure.

FIG. 12B illustrates a simulation result of the power amplifier 1200 in FIG. 12A in accordance with some embodiments of the present disclosure. The electrical characteristics and the advantages of the power amplifier 1200 are similar to those of the power amplifier 1000 in FIG. 10A. For example, as shown in FIG. 12B, the current I121 continuously changes from 0 mA to about 90 mA as the voltage V111 continuously changes from 0 V to about 0.7 V.

As used herein, the singular terms "a," "an," and "the" may include a plurality of referents unless the context clearly dictates otherwise.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "approximately" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A power amplifier circuit comprising:
 a voltage-controlled current source configured to receive a first voltage and to generate a first current; and
 a current mirror connected to the voltage-controlled current source and configured to generate a second current in response to the first current,
 wherein the second current continuously changes from 0 mA to about 120 mA as the first voltage continuously changes from 0 V to about 1 V,
 wherein the voltage-controlled current source comprises:
  an amplifier having a first input, a second input and an output; and
  a first resistor connected to the first input of the amplifier,
  wherein the amplifier is configured to receive the first voltage through the first resistor.

2. The power amplifier circuit of claim 1, wherein the second current changes from 0 mA to about 50 mA as the first voltage continuously changes from 0 V to about 1 V.

3. The power amplifier circuit of claim 1, wherein the voltage-controlled current source further comprises a second resistor connected to the output of the amplifier, and wherein the first current flows through the second resistor.

4. The power amplifier circuit of claim 3, wherein the voltage-controlled current source further comprises:
a third resistor connected between the second input and the output of the amplifier; and
a fourth resistor connected between the second input of the amplifier and a ground.

5. The power amplifier circuit of claim 4, wherein the voltage-controlled current source further comprises a fifth resistor connected between the first input of the amplifier and the current mirror.

6. The power amplifier circuit of claim 1, wherein the current mirror comprises:
a first transistor having a base, an emitter connected to a ground and a collector connected to the voltage-controlled current source; and
a second transistor having a base electrically connected to the base of the first transistor, an emitter connected to the ground and a collector configured to draw the second current.

7. The power amplifier circuit of claim 6, further comprising a first resistor connected between the base of the first transistor and the base of the second transistor.

8. The power amplifier circuit of claim 7, further comprising:
a third transistor having a base connected to the voltage-controlled current source, a collector connected to a second voltage, and an emitter;
a second resistor connected between the emitter of the third transistor and the base of the first transistor; and
a third resistor connected between the emitter of the third transistor and the base of second transistor.

9. The power amplifier circuit of claim 8, wherein the second current substantially remains at a fixed value as the second voltage continuously changes from about 3.2 V to about 4.2 V.

10. The power amplifier circuit of claim 8, wherein the collector of the second transistor is connected to a third voltage.

11. The power amplifier circuit of claim 10, wherein the second current continuously changes from 35 mA to about 55 mA as the third voltage continuously changes from 0.5 V to about 4.2 V.

12. The power amplifier circuit of claim 1, wherein the second current changes between about 49.4 mA and about 49.7 mA as a temperature of the power amplifier changes from about −20° C. to about 120° C.

13. The power amplifier circuit of claim 1, wherein the voltage-controlled current source further comprises a second resistor between the first output and the second output of the voltage-controlled current source and connected to the output of the amplifier.

14. The power amplifier circuit of claim 13, wherein the voltage-controlled current source further comprises:
a third resistor connected between the second input and the output of the amplifier; and
a fourth resistor connected between the second input of the amplifier and a ground.

15. The power amplifier circuit of claim 14, wherein the voltage-controlled current source further comprises a fifth resistor connected between the first input of the amplifier and the second output of the voltage-controlled current source.

16. A power amplifier circuit comprising:
a voltage-controlled current source having an input, a first output and a second output, the input of the voltage-controlled current source configured to receive a first voltage and to generate a first current flowing between the first output and the second output; and
a current mirror connected to the first output and the second output of the voltage-controlled current source and configured to generate a second current in response to the first current,
wherein the current mirror is configured to generate the second current when the first voltage is greater than 0 V,
wherein the voltage-controlled current source comprises:
an amplifier having a first input, a second input and an output connected to the first output of the voltage-controlled current source; and
a first resistor connected to the first input of the amplifier,
wherein the amplifier is configured to receive the first voltage through the first resistor.

17. The power amplifier circuit of claim 16, wherein the second current changes from 0 mA to about 50 mA as the first voltage continuously changes from 0 V to about 1 V.

18. The power amplifier circuit of claim 16, wherein the current mirror comprises:
a first transistor having a base, an emitter connected to a ground, and a collector connected to the second output of the voltage-controlled current source; and
a second transistor having a base electrically connected to the base of the first transistor, an emitter connected to the ground, and a collector configured to draw the second current.

19. The power amplifier circuit of claim 18, further comprising a first resistor connected between the base of the first transistor and the base of the second transistor.

20. The power amplifier circuit of claim 19, further comprising:
a third transistor having a base connected to the first output of the voltage-controlled current source, a collector connected to a second voltage, and an emitter;
a second resistor connected between the emitter of the third transistor and the base of the first transistor; and
a third resistor connected between the emitter of the third transistor and the base of second transistor.

21. The power amplifier circuit of claim 20, wherein the second current substantially remains at a fixed value as the second voltage continuously changes from about 3.2 V to about 4.2 V.

22. The power amplifier circuit of claim 20, wherein the collector of the second transistor is connected to a third voltage.

23. The power amplifier circuit of claim 22, wherein the second current continuously changes from 35 mA to about 55 mA as the third voltage continuously changes from 0.5 V to about 4.2 V.

24. The power amplifier circuit of claim 16, wherein the second current changes between about 49.4 mA and about 49.7 mA as a temperature of the power amplifier changes from about −20° C. to about 120° C.

* * * * *